(12) United States Patent
McCall et al.

(10) Patent No.: US 6,601,768 B2
(45) Date of Patent: Aug. 5, 2003

(54) IMAGING MODULE FOR OPTICAL READER COMPRISING REFRACTIVE DIFFUSER

(75) Inventors: Melvin D. McCall, Homer, NY (US); Vivian L. Hunter, Baldwinsville, NY (US); Charles P. Barber, Fayetteville, NY (US); William H. Havens, Skaneateles, NY (US); Eric Coleman, Liverpool, NY (US); Michael Ehrhart, Liverpool, NY (US); Robert J. Hennick, Auburn, NY (US)

(73) Assignee: Welch Allyn Data Collection, Inc., Skaneateles Falls, NY (US)

( * ) Notice: Subject to any disclaimer, the term of this patent is extended or adjusted under 35 U.S.C. 154(b) by 0 days.

(21) Appl. No.: 09/802,579

(22) Filed: Mar. 8, 2001

(65) Prior Publication Data

US 2002/0125322 A1 Sep. 12, 2002

(51) Int. Cl.⁷ .................................................. G06K 7/10
(52) U.S. Cl. ........................... 235/462.42; 235/462.41; 235/454; 235/472.01
(58) Field of Search ....................... 235/462.24, 462.01, 235/472.01, 462.42

(56) References Cited

U.S. PATENT DOCUMENTS

| | | | |
|---|---|---|---|
| 4,315,245 A | 2/1982 | Nakahara et al. | |
| 4,471,384 A | 9/1984 | Sato et al. | |
| 4,818,847 A | 4/1989 | Hara et al. | |
| 4,847,490 A | 7/1989 | Nishikama | |
| 5,010,241 A | 4/1991 | Butterworth | |
| 5,019,699 A | 5/1991 | Koenck | |
| 5,059,778 A | 10/1991 | Zouzoulas et al. | |
| 5,132,525 A | 7/1992 | Swartz et al. | |
| 5,280,162 A | 1/1994 | Marwin | |
| 5,291,009 A | * 3/1994 | Roustaei | |

(List continued on next page.)

FOREIGN PATENT DOCUMENTS

| | | |
|---|---|---|
| DE | 1 233 038 B | 1/1967 |
| DE | 1240 149 B | 5/1967 |
| EP | 0 516 927 A2 | 12/1992 |
| EP | 0 947 924 A2 | 1/2000 |
| EP | 1 079 466 A2 | 2/2001 |
| EP | 1 111 538 A1 | 6/2001 |
| EP | 1 128 314 A1 | 8/2001 |
| EP | 1 128 315 A1 | 8/2001 |
| JP | 54021869 | 2/1979 |
| JP | 54021871 | 2/1979 |
| JP | 54109425 | 8/1979 |
| JP | 56101256 | 7/1981 |
| JP | 56151140 | 9/1981 |
| JP | 61231912 | 9/1986 |
| JP | 01086220 | 4/1989 |
| JP | 02041496 | 2/1990 |
| JP | 4367085 | 12/1992 |
| JP | 05096227 | 4/1993 |
| JP | 07011942 | 1/1995 |
| JP | 09035856 | 2/1997 |
| WO | WO 94/27250 A1 | 5/1994 |
| WO | WO 97/28512 A1 | 1/1997 |
| WO | WO 97/15024 A1 | 4/1997 |
| WO | WO 01/13158 A1 | 2/2001 |
| WO | WO 01/26035 A2 | 4/2001 |

*Primary Examiner*—Michael G. Lee
*Assistant Examiner*—Ahshik Kim
(74) *Attorney, Agent, or Firm*—Wall, Marjama & Bilinski LLP

(57) ABSTRACT

The present invention is an imaging module including various optical components and a circuit board, which, in one embodiment, carries essentially an entirety of illumination and aiming LEDs of the module. The module includes a combination of features which result in the size of the module being reduced. The module may comprise a refractive optic diffuser plate manufactured using a textured surface mold.

41 Claims, 19 Drawing Sheets

U.S. PATENT DOCUMENTS

| | | |
|---|---|---|
| 5,359,185 A | 10/1994 | Hanson |
| 5,468,950 A | 11/1995 | Hanson |
| 5,504,317 A * | 4/1996 | Takahashi ............... 235/462.42 |
| 5,510,607 A | 4/1996 | Ishikawa |
| 5,572,006 A | 11/1996 | Wang et al. |
| 5,598,007 A | 1/1997 | Bunce et al. |
| 5,702,059 A * | 12/1997 | Chu et al. ............... 235/472.01 |
| 5,703,349 A | 12/1997 | Meyerson et al. |
| 5,734,153 A | 3/1998 | Swartz et al. |
| 5,743,633 A * | 4/1998 | Chau et al. ................. 362/331 |
| 5,756,981 A | 5/1998 | Roustaei et al. |
| 5,763,864 A | 6/1998 | O'Hagan et al. |
| 5,783,811 A | 7/1998 | Feng et al. |
| 5,818,028 A | 10/1998 | Meyerson et al. |
| 5,837,985 A | 11/1998 | Karpen |
| 5,850,078 A | 12/1998 | Giordano et al. |
| 5,877,487 A | 3/1999 | Tani et al. |
| 5,894,348 A | 4/1999 | Bacchi et al. |
| 5,912,451 A | 6/1999 | Gurevich et al. |
| 5,917,171 A | 6/1999 | Sasai |
| 5,920,061 A | 7/1999 | Feng |
| 5,949,057 A | 9/1999 | Feng |
| 5,992,751 A | 11/1999 | Laser |
| 5,992,753 A | 11/1999 | Xu |
| 6,019,286 A | 2/2000 | Li et al. |
| 6,029,893 A | 2/2000 | Tan et al. |
| 6,039,255 A | 3/2000 | Seo |
| 6,045,047 A | 4/2000 | Pidhirny et al. |
| 6,060,722 A | 5/2000 | Havens et al. |
| 6,062,475 A | 5/2000 | Feng |
| 6,092,728 A | 7/2000 | Li et al. |
| 6,105,869 A * | 8/2000 | Scharf et al. ................ 235/454 |
| 6,123,263 A * | 9/2000 | Feng ..................... 235/462.42 |
| 6,129,276 A | 10/2000 | Jelen et al. |
| 6,145,743 A * | 11/2000 | Dvorkis et al. ......... 235/462.01 |
| 6,164,544 A * | 12/2000 | Schwartz et al. ....... 235/462.43 |
| 6,168,079 B1 | 1/2001 | Becker et al. |
| 6,179,208 B1 | 1/2001 | Feng |
| 6,223,986 B1 | 5/2001 | Bobba et al. |
| 6,283,374 B1 | 9/2001 | Fantone et al. |

\* cited by examiner

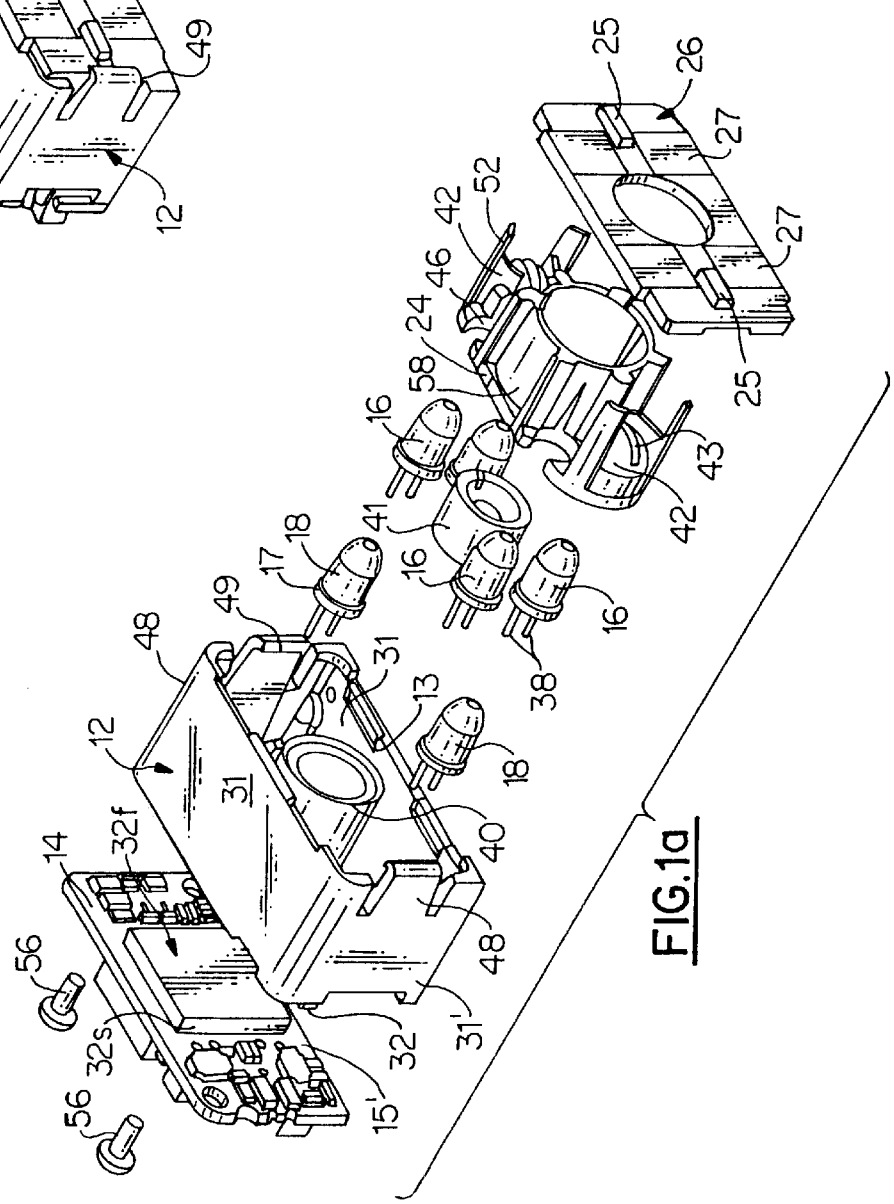

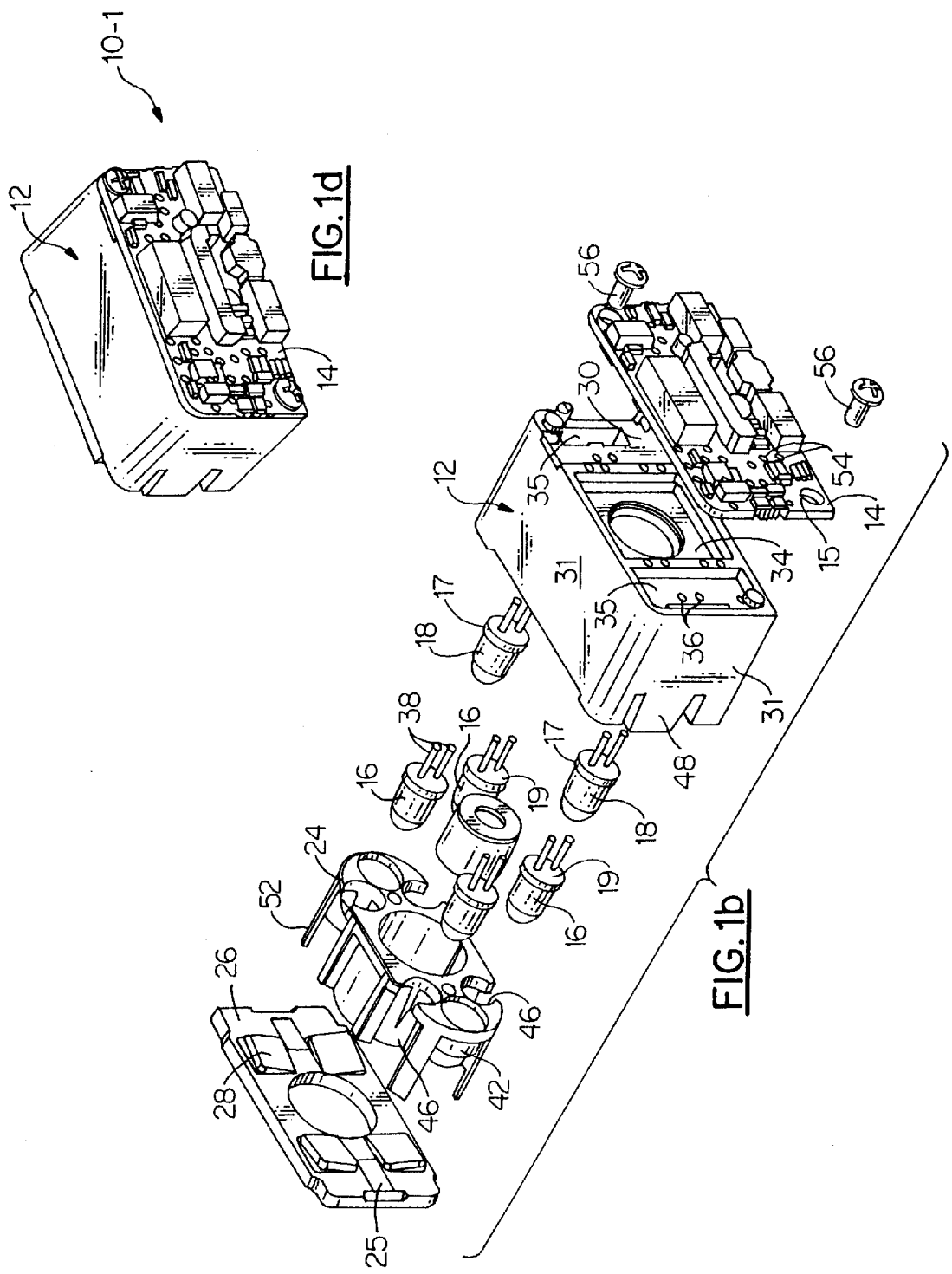

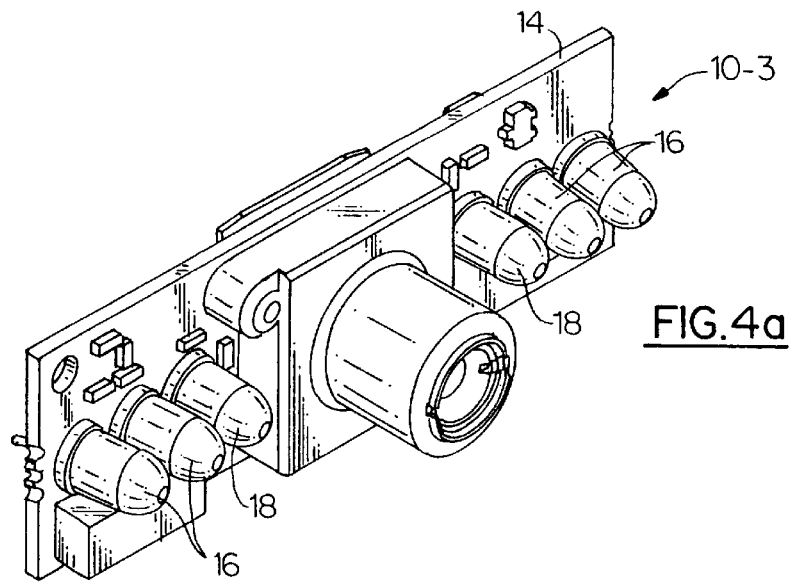
FIG.4a
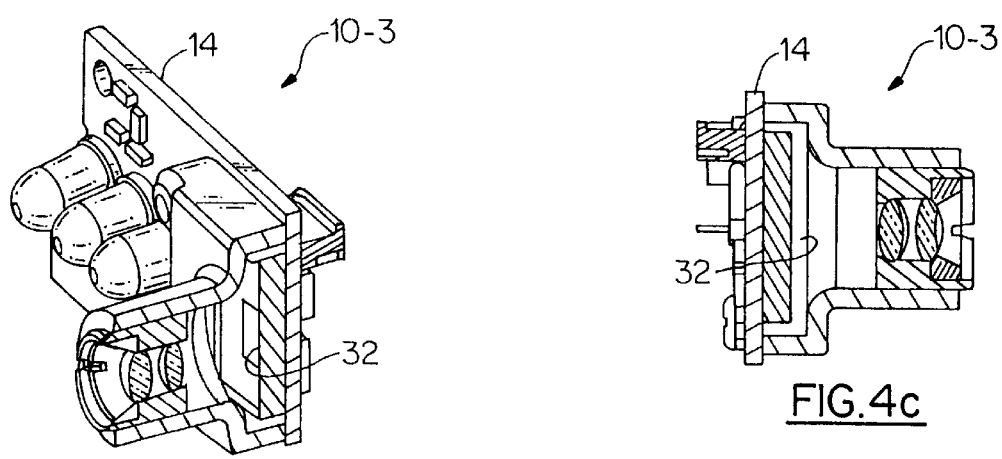
FIG.4b
FIG.4c
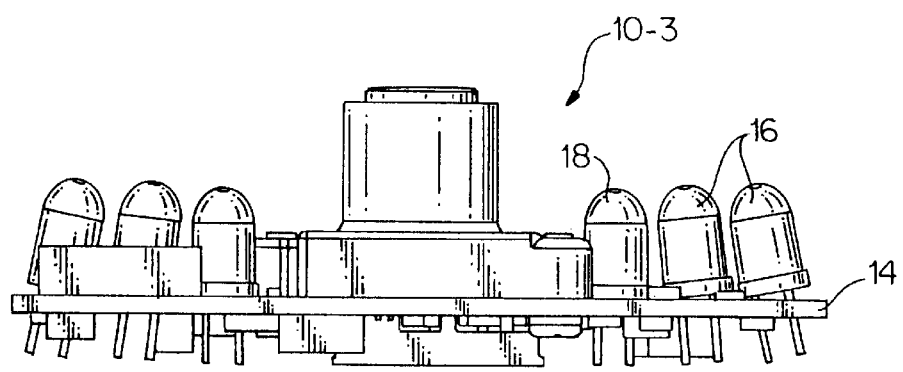
FIG.4d

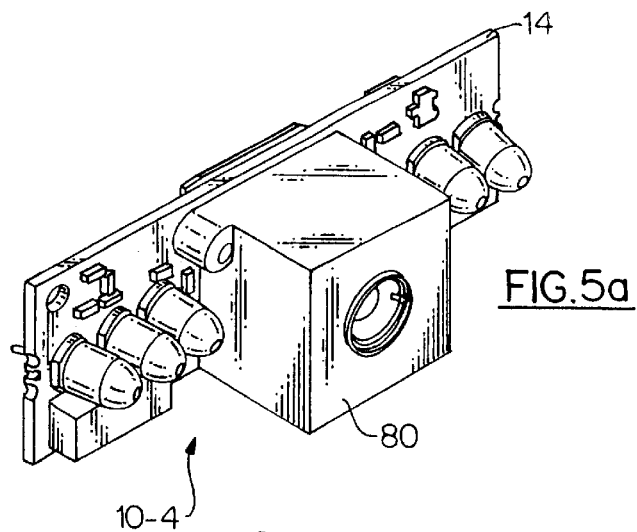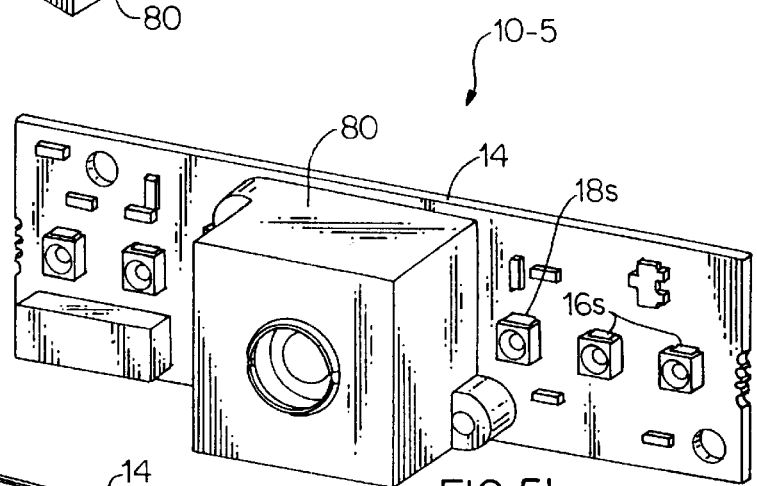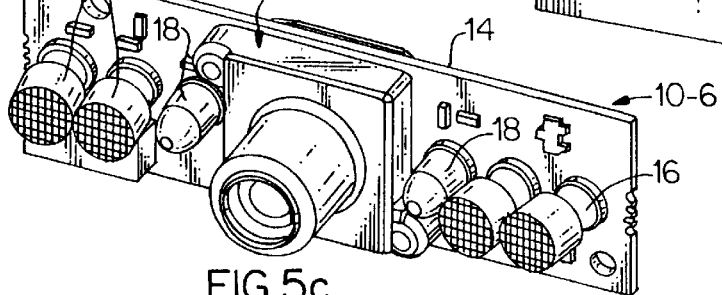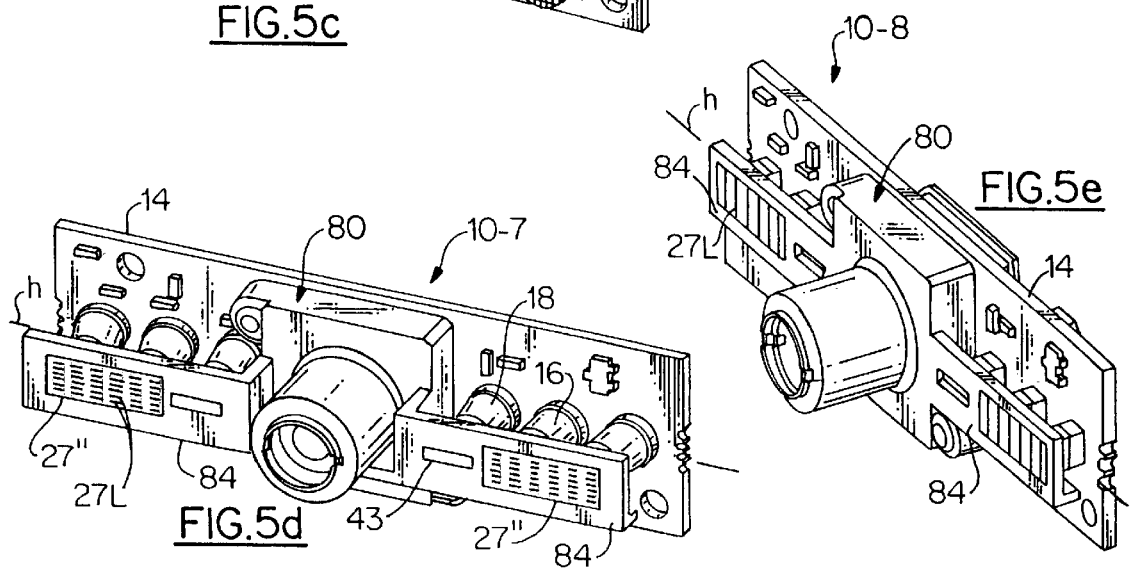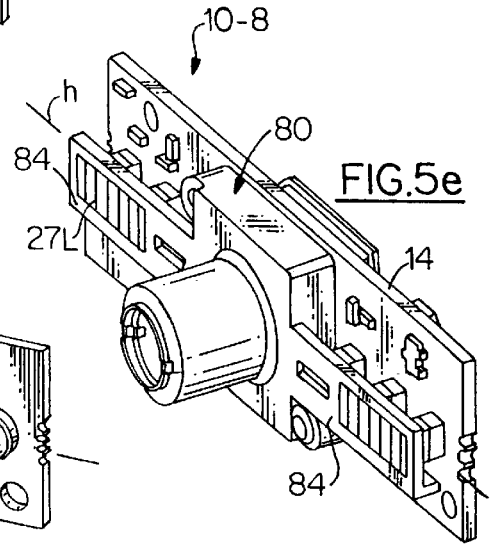

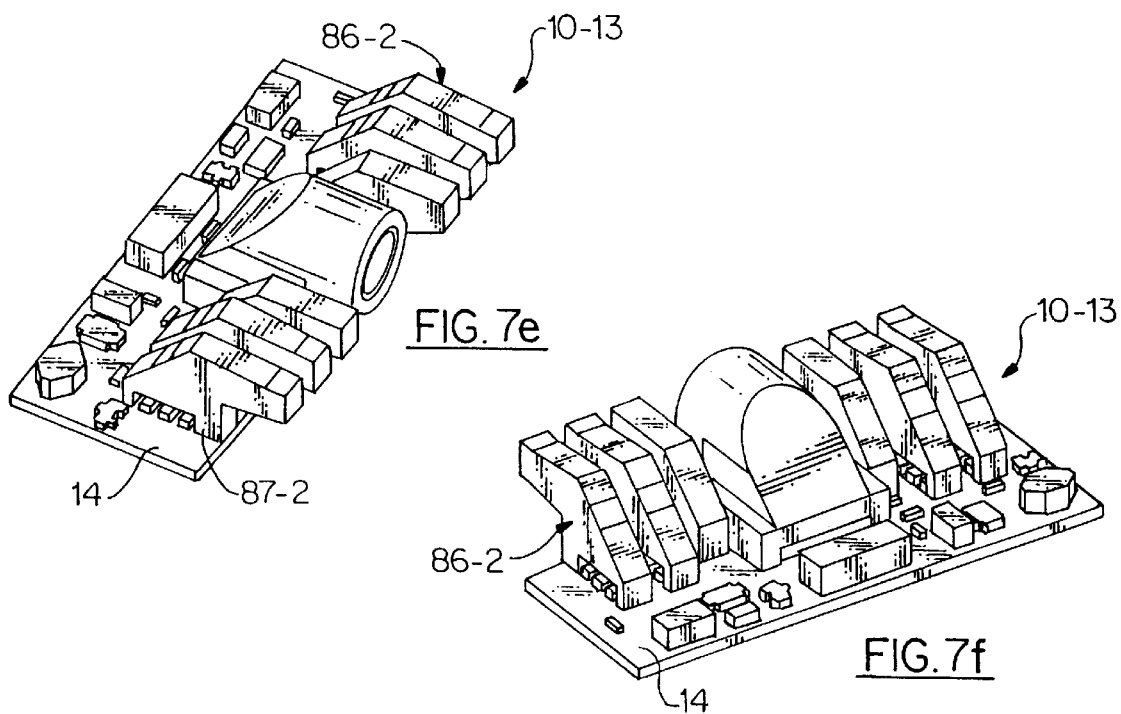
FIG.7e
FIG.7f
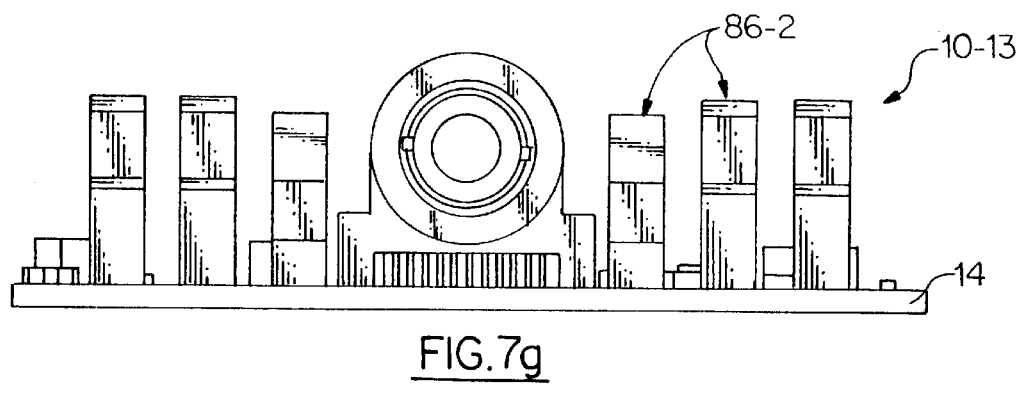
FIG.7g
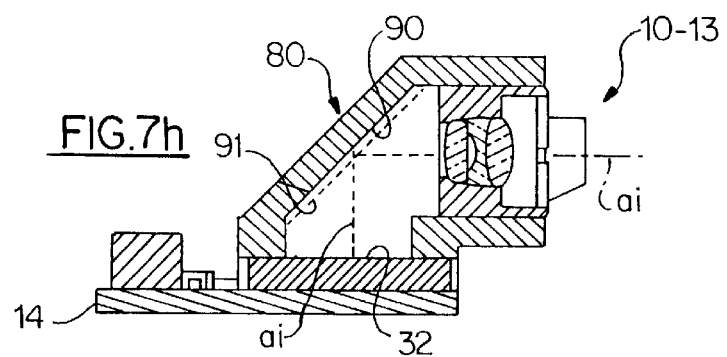
FIG.7h

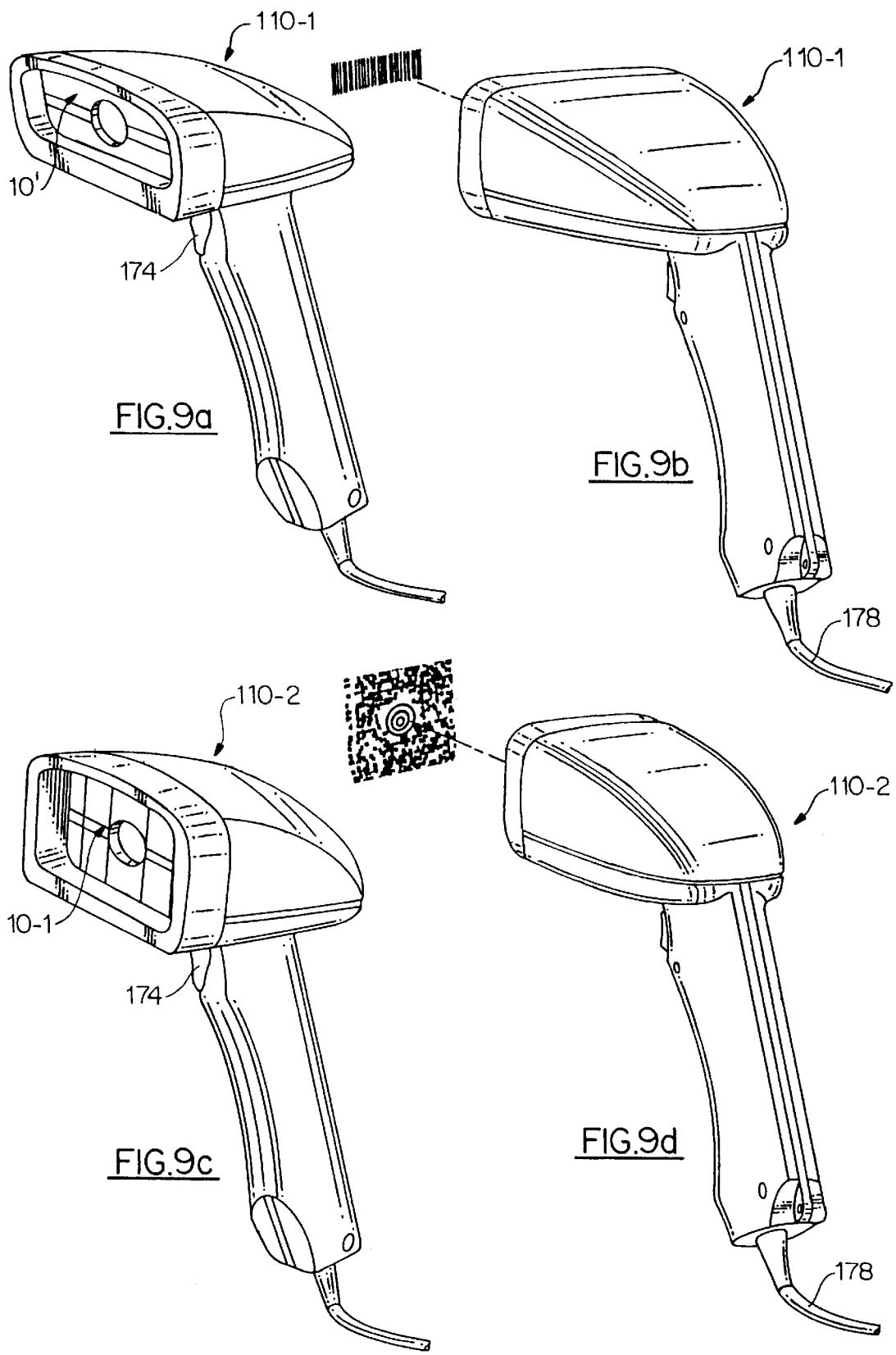

IMAGING MODULE FOR OPTICAL READER COMPRISING REFRACTIVE DIFFUSER

FIELD OF THE INVENTION

The present invention relates to optical reading devices in general and in particular to an apparatus for packaging illumination optical elements, receive optical elements, and signal processing elements of an optical reader.

BACKGROUND OF THE INVENTION

Currently available optical readers include illumination elements, electronic signal processing circuits, image capture circuits and decoding circuits that are carried by more than one circuit board. For example, shown in U.S. Pat. No. 5,780,834 is an optical reader having numerous circuit boards, including an LED board for carrying illumination LEDs, an "imaging board" carrying an image sensor and circuitry for processing signals generated from the image sensor, and a "mother board" carrying image capture and decoding circuitry. U.S. Pat. No. 5,521,366 describes a modular housing having a rear printed circuit board, a front printed circuit board and a LED circuit board on which LEDs are mounted.

Assembly of a prior art reader requires mounting of separate circuit boards to separate internal structures of a reader, and providing electrical connection between the multiple circuit boards. In addition to being difficult to assemble, the multiple circuit board design imposes size requirements on the optical reader housing in which the electrical components are to be integrated.

There is a need for an easier to manufacture and lower cost packaging apparatus for packaging optical and electrical components of an optical reader.

SUMMARY OF THE INVENTION

According to its major aspects and broadly stated the present invention is a module for packaging optical illumination, optical receive, and electrical signal processing components of an optical reader.

The module includes a frame which carries a circuit board, preferably a printed circuit board (PCB) and various optical components. In one embodiment, the frame includes a back plate having a retainer for receiving an optical lens barrel, and a recess for receiving and aligning an image sensor which is carried by the PCB. The frame may also include resilient fingers which enable the frame to receive certain optical components of the module in an adhesiveless snap-fitting arrangement.

According to a preferred assembly method for assembling the module, the PCB is first mounted onto the frame's back plate such that the image sensor of the PCB is received and aligned by the recess of the back plate. Next, illumination and aiming LEDs are soldered to the PCB to mount the LEDs. As a space conserving measure, the LEDs may be mounted so that a portion of rear surfaces of the illumination LEDs oppose a portion of the top surface of the image sensor when mounted.

After the LEDs are mounted to the PCB, additional components are incorporated in the module. In a preferred embodiment, a lens barrel is incorporated in the retainer, then an aperture plate having domed apertures for shaping light rays emanating from the aiming LEDs is placed over the LEDs. Finally, an optical plate for diffusing light rays emanating from the illumination LEDs is snap-fit into the frame. The optical plate may comprise discreet diffuser elements or may comprise a substantially uniform diffuser surface formed substantially over an entire surface thereof except for areas of the plate in which aiming optic elements are incorporated.

In addition to having diffusers for diffusing illumination light, the optical plate may also include optical elements for imaging light from the apertures onto a target defined by a reader's field of view. In one embodiment of the invention, the aiming LEDs and their associated optics project a solitary horizontal aiming line onto a target in a field of view.

In another embodiment, the aiming LEDs and their associated optics project a split horizontal line aiming pattern onto a target in a field of view. The gap defined by the line segments of the split horizontal aiming line aid a user in locating the center of an optical reader's field of view.

In another embodiment of the imaging module, the imaging module frame is deleted and the module retainer assembly is mounted to and supported entirely by the printed circuit board prior to being installed in a reader housing.

In another embodiment of the imaging module, the components of the imaging module are mounted on a "flex strip" type printed circuit board.

In another embodiment of the imaging module, light pipes are mounted to the printed circuit board. The light pipes transmit light from a source location proximate the circuit board to a location remote from the source location. The light pipes may be molded light pipes or may be provided by fiber optic cable.

In another embodiment of the imaging module, an image sensor is face-mounted to a printed circuit board, and folding optics are provided in the retainer assembly of the module for folding the optical imaging path so that the imaging path extends substantially parallel with the image sensor and circuit board. This type of module is especially well suited for installation in "thin" reader housings such as a reader housing for a personal data assistant or "PDA" device.

The printed circuit board may be a full function printed circuit board which carries a solid state image sensor and essentially the entirety of electronic circuitry required for supporting essentially all of the processing and control operations to be performed by the optical device in which the module is to be incorporated. Circuitry incorporated in the single PCB includes signal processing circuitry for processing signals generated from the image sensor, image capture circuitry for storing image data, and decoding and/or recognizing circuitry for decoding and/or recognizing indicia represented in image data that has been stored.

In order to accommodate the full function circuit board, the rear surface of the frame's back plate should be made to have a central recess for aligning and receiving the image sensor, and peripheral recesses for accommodating circuit elements such as electrical components and/or wiring which may emanate from the front surface of the full function printed circuit board.

These and other details, advantages and benefits of the present invention will become apparent from the detailed description of the preferred embodiment herein below.

BRIEF DESCRIPTION OF THE DRAWINGS

For a fuller understanding of the nature and objects of the invention, reference should be made to the following detailed description of a preferred mode of practicing the invention, read in connection with the accompanying drawings, in which:

FIG. 1A is a front perspective assembly diagram illustrating assembly of an image capture module according to the invention;

FIG. 1B is a rear perspective assembly diagram illustrating assembly of an image capture module according to the invention;

FIG. 1C is a front perspective view of an assembled image capture module according to the invention;

FIG. 1D is a rear perspective view of an assembled image capture module according to the invention;

FIG. 2b is a blown up view of the surface of the plate shown in FIG. 2a;

FIGS. 4a–4d are various views of another frameless imaging module according to the invention;

FIGS. 5a–5e are perspective views of various alternative frameless imaging modules according to the invention;

FIGS. 7e–7h are various views of an imaging module according to the invention having molded light pipe illumination and a face mounted image sensor;

FIGS. 9a–9k are views of various housings of which the module of the invention may be incorporated;

DETAILED DESCRIPTION OF THE INVENTION

Figure 1E:
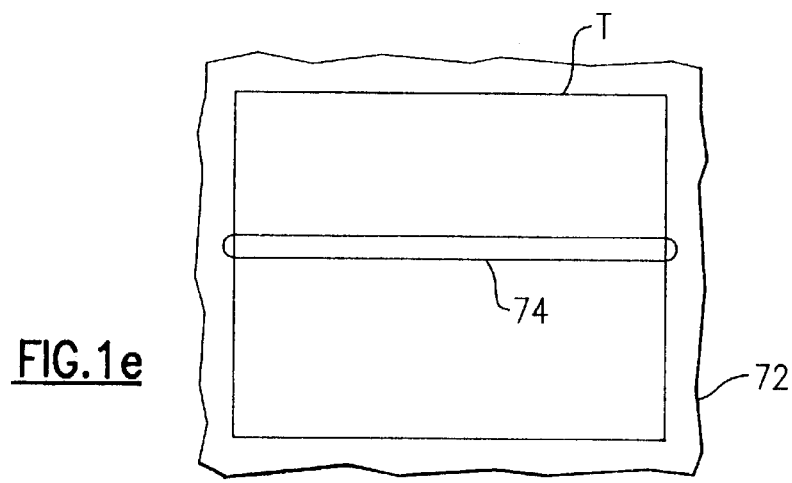
FIG. 1E is a representation of an exemplary illumination and aiming pattern projected by a module in accordance with the invention.

An embodiment of an imaging module 10 according to the invention is shown in FIGS. 1A–1D. Imaging module 10-1 is specifically designed for use in an indicia reader such as a bar code reader, an optical character recognition (OCR) reader or in a reader having both bar code and OCR reading capabilities. However, it will be understood that features of module 10 may also find use in other devices requiring image capture including personal data assistants, "PDA's," video cameras, digital cameras, cellular phones, and medical viewing instruments.

Module 10-1 includes a mounting frame 12 which is adapted to receive both electrical components and optical components of an imaging system. Specifically, mounting frame 12 receives a circuit board, such as a printed circuit board (PCB) 14, illumination LEDs 16, aiming LEDs 18, aperture plate 24 and optical plate 26.

More specifically, the frame 12 includes a back plate 30 and sidewalls including top sidewalls 31 and side sidewalls 31'. Back plate 30 includes a recess 34 for receiving a solid state image sensor chip 32 and a plurality of pin holes 36 for receiving leads 38 of illumination and/or aiming light sources, provided by LEDs 16 and 18. Back plate 30 further includes a retainer 40 for receiving a receive optics lens assembly 41, e.g. a lens barrel, which may be installed in retainer 40 prior to or after any step in the assembly process as described in greater detail below.

In assembling the module 10-1, PCB 14 is first mounted to back plate 30 using screws 56 and frame 12 is oriented so that an opening 13 is exposed. When PCB 14 is mounted to back plate 30 the image sensor 32 carried by PCB 14 is received by center recess 34 which is shaped complimentary with the shape of image sensor 32 as shown. After mounting PCB 14 to frame 12, an assembler mounts illumination LEDs 16 and aiming LEDs 18 to PCB 14.

To mount LEDs 16 and 18 to PCB 14, the leads 38 of LEDs 16 and 18 are pushed through aligned pin holes 36 and 54 of back plate 30 and PCB 14, then the LEDs 16 and 18 are soldered to PCB 14. Preferably, all of the LEDs 16 and 18 are positioned in their respective pin holes before soldering. In soldering LEDs 16 and 18, the rear surface 15 of PCB 14 should be oriented for easy access by an assembler. To the end that LEDs 16 and 18 remain in a desired orientation which is substantially normal to PCB 14 during soldering, a standardly known fixture (not shown) shaped to receive LEDs 16 and 18 can be temporarily applied over LEDs 16 and 18 through the soldering process.

An important feature of the imaging module is that leads 38 of the illumination LEDs 16 are installed in a nearly abutting relation to sides 32s of image sensor 32 such that a portion of rear surfaces 19 of LEDs 16 oppose a portion of a front surface 32f of image sensor 32 when the LEDs 16 are completely installed. This arrangement reduces the size of the imaging module 12, enabling installation in smaller sized optical readers.

After LEDs 16 and 18 are mounted onto PCB 14 in the manner described above, the aperture plate 24 is mounted into the frame 12, the plate having domes 42 which fit over the aiming LEDs 18. The domes are preferably opaque to substantially block all light emanating from aiming LEDs 18, except light exiting the domes through slit apertures 43. Slit apertures 43 should be formed so that a desired shaped aiming pattern of illumination is projected onto a target, T. Preferably, aperture slits 43 are shaped rectangularly so that a horizontal line pattern is projected onto a target.

Aperture plate 24 further includes a number of cutaway sections 46 providing clearance to allow the aperture plate to be fitted over the illumination LEDs 16. The domes 42 and cutaway sections 46 are formed so they do not contact LEDs 16. In the embodiment shown, each LED is held in a desired orientation while being soldered, so that the flat surfaces of LED bases 17 are biased against the flat surface of back plate 30 during the assembly process. In a further aspect, aperture plate 24 includes a shroud 58 for preventing light transmitted by the LEDs 16 and 18 from interfering with the receive optical systems of the module.

After aperture plate 24 is placed over LEDs 16 and 18 and moved toward back plate 30, an optical plate 26 is snap-fitted into the opening 13 of the frame 12. Optical plate 26 includes diffusers 27 for diffusing light emanating from the illumination LEDs. In addition to having diffusers 27 formed on a front surface thereof optical plate 26 may further have wedges 28 formed on an inner surface thereof. Wedges 28 direct light from LEDs 16 toward corners of a target T so as to improve the uniformity of a target's illumination.

Resilient fingers 48 having hook ends 49 are formed in the top sidewalls 31 or side sidewalls 31' of frame 12 to enable snap-fitting of the optical plate 26 onto frame 12. In the embodiment shown, the optical plate 26 is snap-fitted onto the frame 12 by pulling back the resilient fingers 48, pushing the optical 26 toward the back plate 30, then releasing the fingers 48 to lock plate 26 in position inside module 10-1. The plate and fingers may be formed.

The aperture plate 24 includes spacers 52 which operate to bias aperture plate 24 toward back plate 30 when optical plate 26 is snap fitted onto frame 12. The spacers 52 further transfer the force imparted by fingers 48 on optical plate 26 to the aperture plate 24, securing both the aperture plate 24 and optical plate 26 inside frame 12 without the use of adhesives or outside mechanical securing means, such as screws or pins. In the embodiment of FIG. 1C optical plate 26 includes a separate diffuser 27 for each illumination LED 16. In the alternative embodiment of FIG. 2A a single diffuser 27' is formed substantially throughout the surface of plate 26'.

Figure 2A:
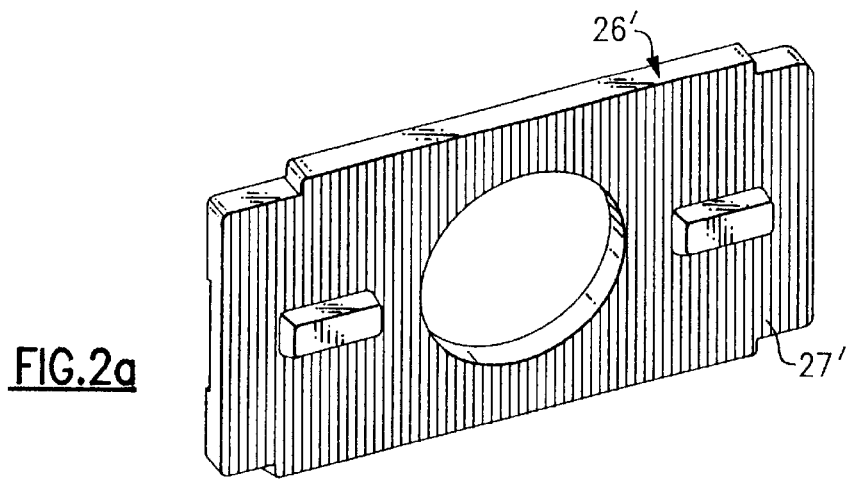
FIG. 2a is an enlarged front view of an alternative optical plate according to the invention.
Figure 2B:
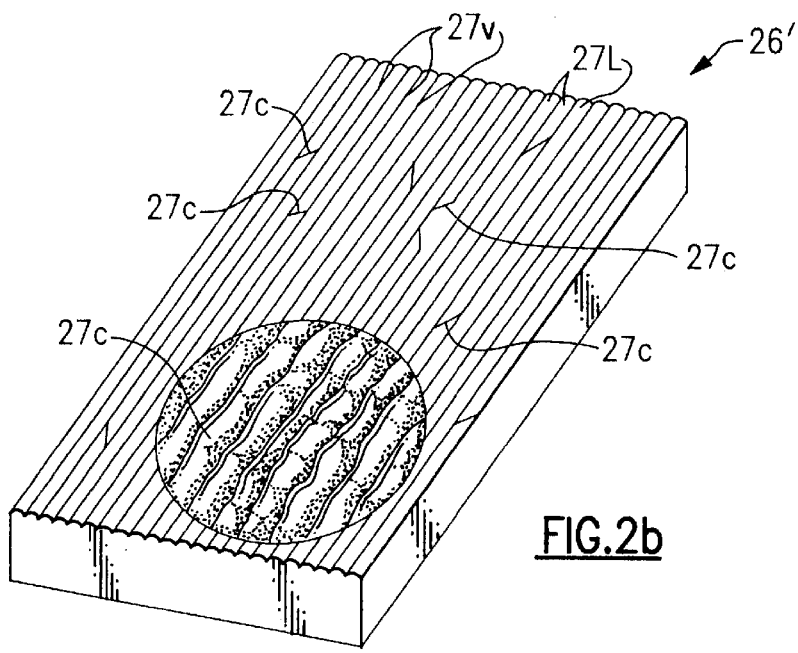
Figure 2C:
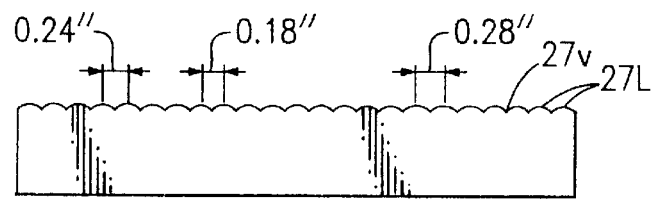
FIG. 2c as an exploded side view of the plate section shown in FIG. 2b.
Figure 2E:
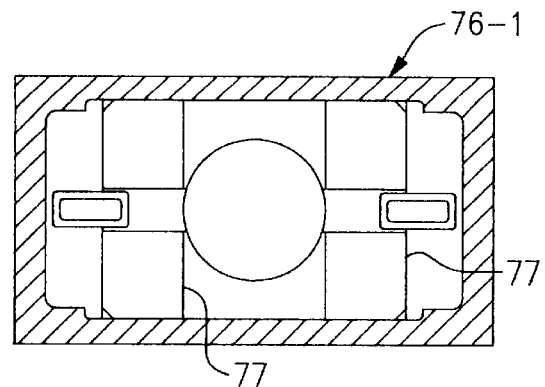
FIGS. 2e and 2f are top views of molds which may be used in the manufacture of optical plates according to the invention.
Figure 2F:
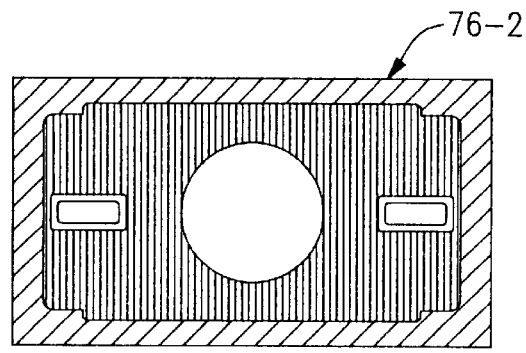
Figure 2D:
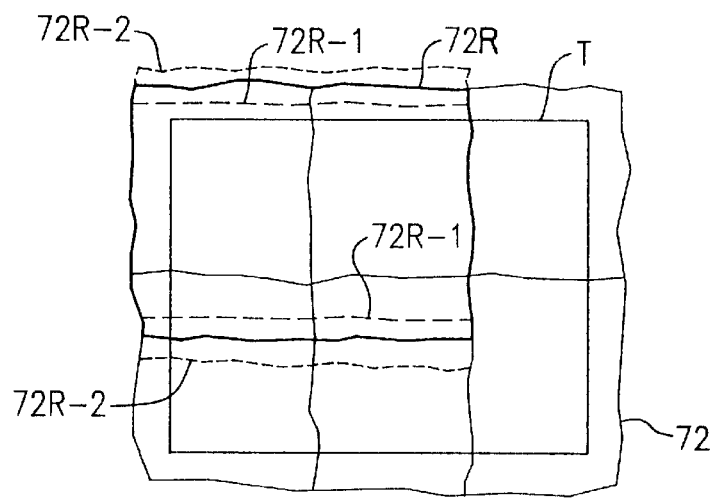
FIG. 2d is an illumination diagram illustrating an illumination pattern according to the invention.
Figure 3A:
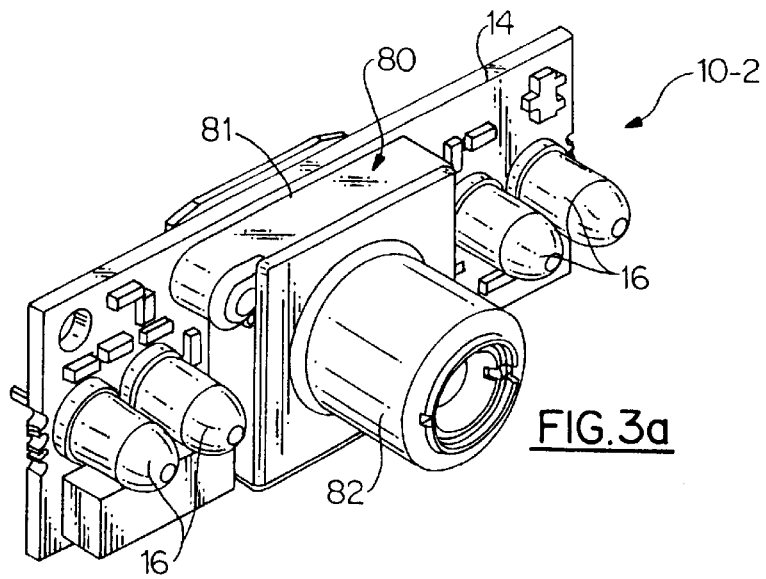
FIGS. 3a–3d are various views of a frameless imaging module according to the invention.
Figure 3B:
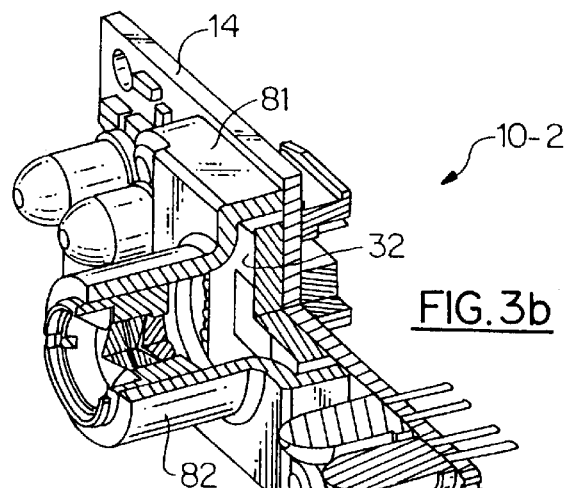
Figure 3C:
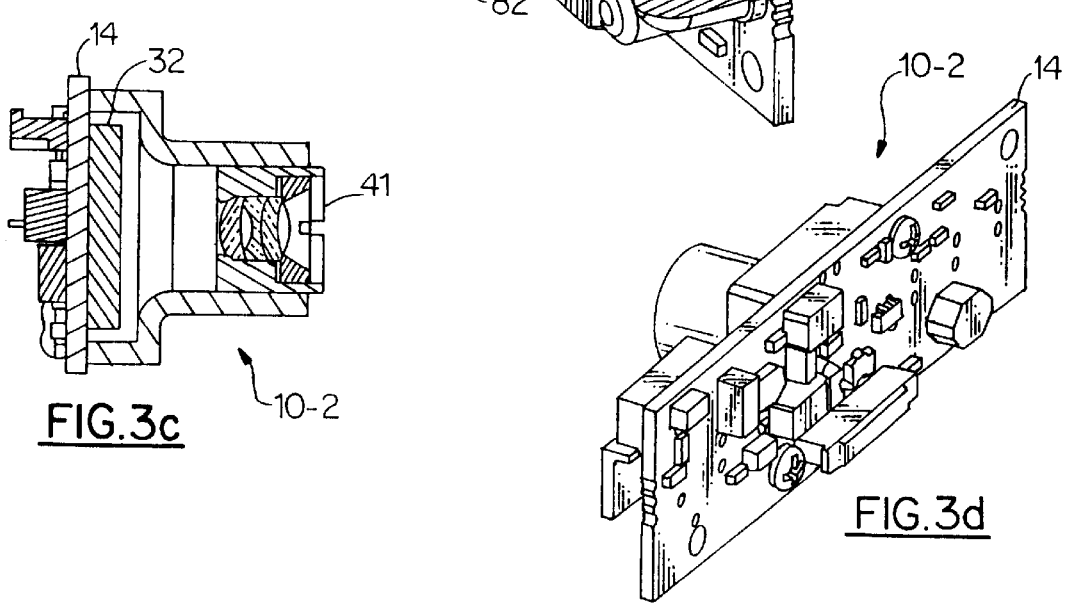
Figure 3D:
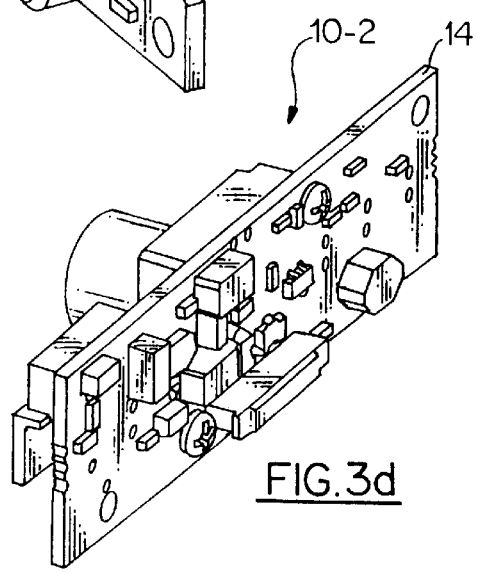
Figure 6A:
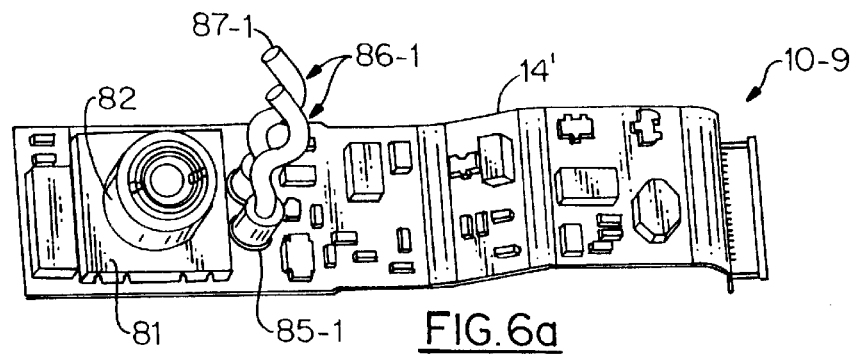
FIGS. 6a–6d are various views of an imaging module according to the invention having light pipe illumination and a flex strip printed circuit board.
Figure 6B:
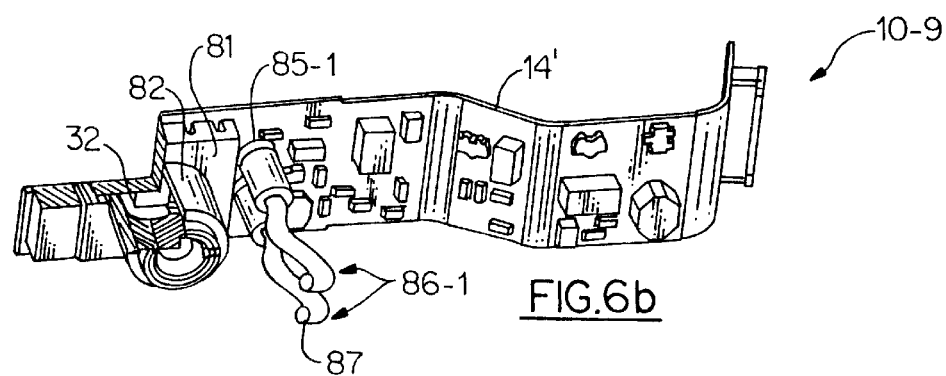
Figure 6C:
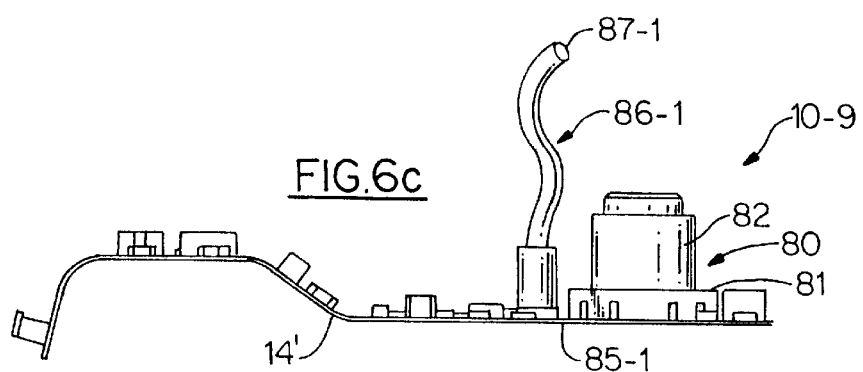
Figure 6D:
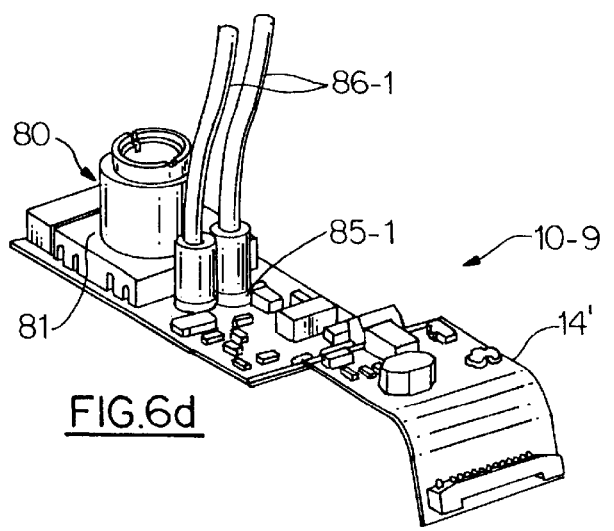

For substantially uniform illumination of a target area T in an overall pattern 72 corresponding to the field of view of image sensor 32 (in which corners are illuminated to a brightness of at least about 50% of the target areas maximum brightness), light emanating from each LED in a four LED illumination system should be diffused to provide a substantially rectangular illumination pattern 72R as is shown in FIG. 2d.

Shown in FIG. 2e is a surface of a mold 76-1 for use in manufacturing the multiple diffuser optical plate of FIG. 1c, mold 76-1 may have installed therein separately manufactured diffractive mold element 77. Mold element 77 installed in mold 76-1 may be of the type manufactured using holographic techniques as are available from Physical Optics Corp. of Torrance, Calif. and Fresnel Optics of Rochester, N.Y. Other manufactures of diffuser optical elements include DOC of Charlotte, N.C., MEMS of Huntsville, Ala. and RPC of Rochester, N.Y.

Shown in FIG. 2f is a surface of a mold 76-2 for use in manufacturing the single diffuser optical plate of FIG. 2a. Mold 76-2 includes a texture formed directly thereon. The texture may be applied by way of an acid resist process. Mold texturing companies, such as Mold Tech, Inc. of Painsville, Ohio specialize in applying textures to molds by way of an acid resist process as in the texture shown in FIG. 2b. A suitable material for use in the manufacture of plate 26 or plate 26', is polycarbonate.

The textured surface mold 76-2 of FIG. 2f is generally less expensive and more durable than the mold having installed diffuser mold elements of FIG. 2e. Mold element 77 is costly to manufacture, and requires frequent replacement. Textured molds as shown in FIG. 2f are typically used in applications such as manufacturing fingerprint-resistant surfaces. As far as is known, light transmissive plates made using insertless textured surface molds as shown in FIG. 2f have been incorporated in products having light sources primarily for the purpose of obscuring the view of a light source, and have not been used to produce controlled target area illumination of an image capture system.

Exploded views of the diffuser surface of optical plate 26' of FIG. 2a are shown in FIGS. 2b and 2c. Plate 26' comprises a plurality of substantially adjacent and substantially cylindrical microlenses 27L. Referring to further aspects of microlenses 27L, microlenses 27L are preferably formed in randomized pattern on plate 26' characterized in that microlenses 27L comprise at least two different sizes without a particular ordering of similar-sized microlenses and without precise parallel relative orientation between the lenses. Randomization of the pattern reduces the formation of "hot spots," concentrated areas of constant higher radiance illumination, on a target area T. In another aspect of plate 26' plate 26' preferably comprises occasional cross-connections 27C defined in the valleys 27v delimiting the various cylindrical microlenses 27L. In the embodiment of FIG. 2b cross-connections 27C connect pairs of adjacent valleys 27v delimiting a microlens 27L. Cross-connection 27c provide diffusion of light in a direction generally transverse to the direction of light diffusion provided by microlenses 27L.

Referring to FIG. 2d, the diffused light pattern generated by a single light source as diffused by diffuser optical plate 26' is designated as pattern 72R of overall pattern 72. Vertically oriented cylindrical microlenses 27L tend to diffuse light in a horizontal direction while the lensing provided by cross-connections 27c tend to diffuse light from a light source in a vertical direction. It can be seen that diffusion patterns can be controlled by appropriate shaping of microlenses 27L. Reducing the incidence of cross-connections 27c would reduce the diffusion of light in the vertical direction. With a reduced incidence of cross-connections an illumination pattern corresponding to a single light source delimited by dashed line 72R-1 may be generated. Increasing the incidence of cross-connections 27c would increase the diffusion of light in the vertical direction. An increased incidence of cross-connections 27c might generate the illumination pattern for a single light source delimited by dashed lines 72R-2. A diffuser comprising a series of spherical refractive optic microlenses would be expected to generate a substantially uniform circular illumination pattern. Diffusing light in a vertical direction to increase the height of an illumination pattern is particularly useful in the case that a target illumination diffuser is incorporated in an imaging module having a single row of horizontally oriented light sources and incorporates a 2D image sensor. Referring ahead to FIGS. 5d and 5e, modules 10-7 and 10-8 comprise diffuser plate inserts 27" having horizontally oriented cylindrical microlenses 27L. Microlenses 27L diffuse light vertically with respect to the horizontal axes h of modules 10-7 and 10-8 thereby increasing the vertical (height) dimension of the illumination pattern projected by modules 10-7 and 10-8. Microlenses 27L of plate 27" may not be formed in a randomized pattern and may not comprise cross-connections 27C. Nevertheless, cylindrical microlenses 27L of plate 27" operate to diffuse light in a direction generally perpendicular to microlenses 27L in a manner similar to microlenses 27L of plate 26'. Plate 27" could be replaced with a plate similar to plate 26' having randomized pattern of microlenses and being modified to include cylindrical microlenses oriented horizontally rather than vertically.

Diffuser plate 26' formed with use of substantially uniformly textured mold 76-2, diffuses light substantially via refractive optics. By contrast, diffuser plate 26 made using a mold e.g. mold 76-1 having holographic formed inserts diffuses light substantially via diffractive optics. Providing diffuser plate 26' diffusing light substantially via refractive optics as opposed to substantially via diffractive optics is advantageous at least for the reason that molds used to make refractive optic diffusers are easier to make and less expensive, while being substantially more durable than molds used to make diffractive optic diffusers. As is known by skilled artisans, diffractive optical characteristics predominate when optical elements transmitting light are in a range of sizes proximate the wavelength of light being transmitted. Imaging modules described herein include light sources that emit light in the range of from about 0.4 to about 1.0 microns. For refractive diffusing of light in this wavelength range the optical elements of a diffuser should have dimension substantially larger than the upper limit of this range, e.g. at least about 10 microns. For example, as best seen in cross sectional view of FIG. 2c, cylindrical microlenses 27L of optical plate 26' may have an apex-to-apex separation that ranges from about 0.018 inches to about 0.028 inches.

Figure 1F:
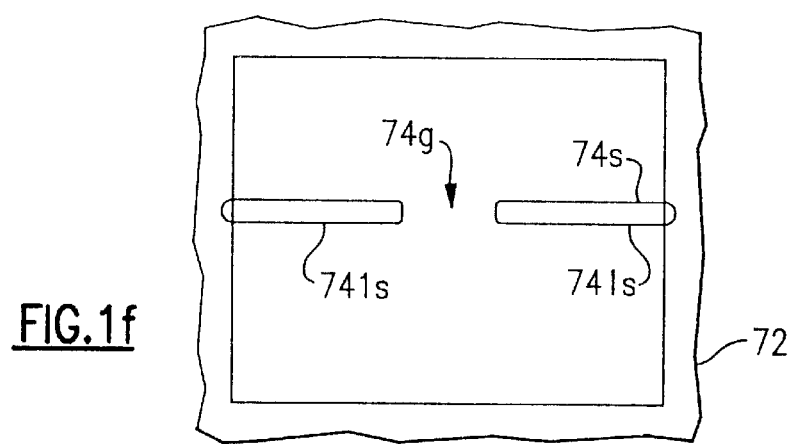
FIG. 1F illustrates a restricted width split horizontal line aiming pattern according to the invention.
Figure 1G:
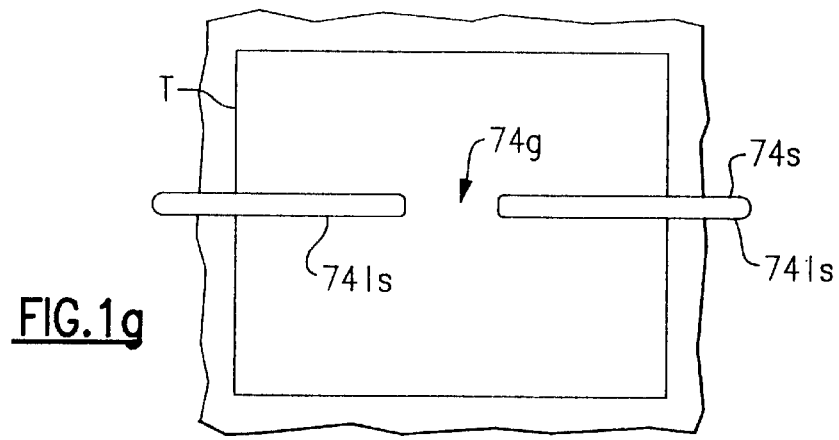
FIG. 1G illustrates a split horizontal line aiming pattern according to the invention.
Figure 1H:
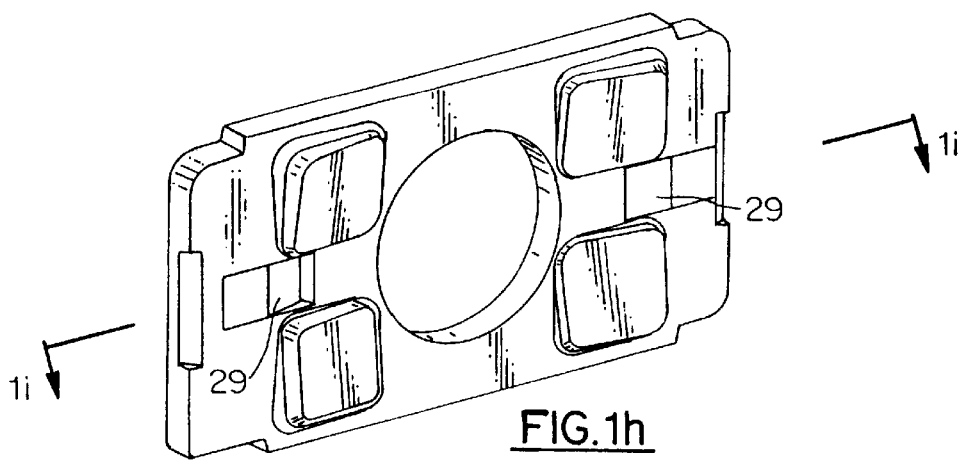
FIG. 1H is an enlarged rear perspective view of an optical plate according to the invention showing an inner surface of an optical plate.

Referring now to aspects of targeting optics of the invention, optical plate 26 may also include cylindrical lenses 25 or other optical elements for imaging light from slit aperture 43 onto a target area T. Representations of illumination and aiming illumination patterns which may be projected by the illumination system of module 10-1 are shown in FIGS. 1e–1g. In FIG. 1e, area 72 represents the region of a target area T illuminated by illumination LEDs 16 while area 74 represents the region of the target area highlighted by aiming LEDs 18 and their associated optics. In the embodiment of FIG. 1e aiming LEDs 18 and their associated optics project a solitary horizontal aiming line 74 onto a target area T.

Figure 1I:
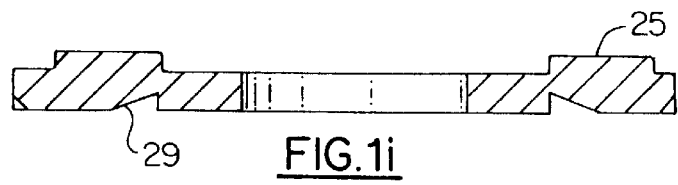
FIG. 1I is a top cross sectional view of the optical plate of FIG. 1H taken at the elevation defined by line I—I of FIG. 1H.
Figure 1J:
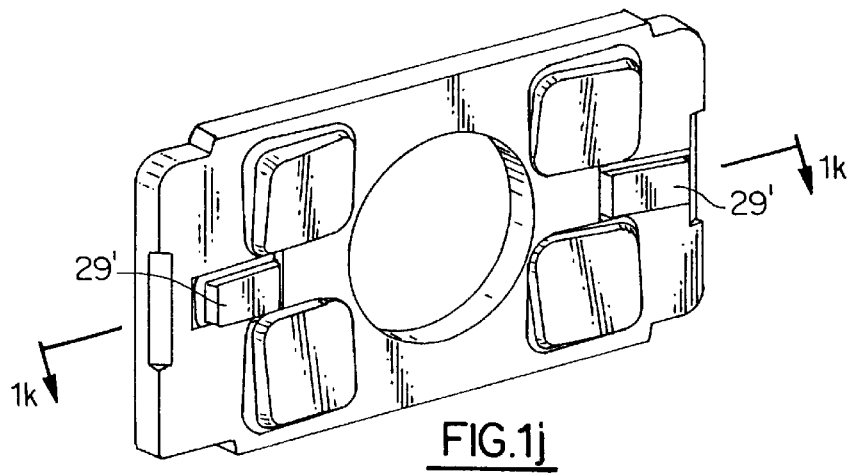
FIG. 1J is an enlarged rear perspective view of an alternative optical plate according the invention.
Figure 1K:
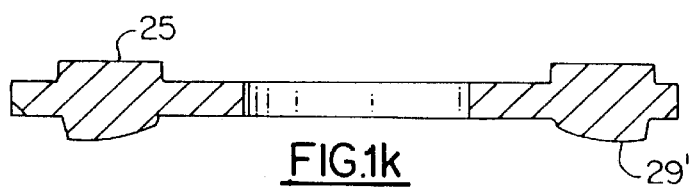
FIG. 1K is a top cross sectional view of the optical plate of FIG. 1J taken at the elevation defined by line K—K of FIG. 1J.

In generating the straight line aiming pattern of FIG. 1e may be generated cylindrical lenses 25 are formed on the outer surface of optical plate 26 as is shown in FIGS. 1I and 1K. Horizontally oriented cylindrical lenses 26 are formed so that when plate 26 is applied over LEDs 18 lenses 25 are aligned coextensively and forwardly relative to slit apertures 43 in order to image light from slit apertures 43 onto a target T, defined by a module's field of view. Cylindrical lenses 25 may have a thickness of about 3 mm and a radius of curvature of about 2.5 mm, convex.

The split horizontal line aiming pattern 74s shown in FIG. 1F may be formed by providing, as shown in FIG. 1I, aiming pattern wedges 29 on the inner surface of optical plate 26 opposite aiming pattern cylindrical lenses 25. Aiming pattern wedges 29 operate to direct light from aperture slits 43 outwardly toward the sides of a target area T so that a gap 74g between two horizontal line segments 74ls is defined in the center of a module's field of view. The split line aiming pattern 74s allows a user to easily align the center of the module's field of view with a center of a region of interest.

It may be desirable to restrict the width of split horizontal line aiming pattern 74s so that line 74s does not extend substantially beyond a reader's target area T as defined by a reader's field of view. In order to restrict the width of split horizontal line aiming pattern 74s, vertically oriented cylindrical lenses may be superimposed on aiming pattern wedges 29 as is illustrated in FIG. 1J to form combined wedge and vertically oriented cylindrical lens elements 29'. Aligning combined wedge and lens elements 29' with slit aperture 43 provides an aiming pattern having the features shown in FIG. 1G, wherein split horizontal line aiming pattern 74s is contained substantially within a target area T defined by a reader's field of view.

Cylindrical lenses 25 of plate 26 operate to collimate light from aperture slits 43. Accordingly, in the embodiment shown having cylindrical lenses 25, the sharpness of aiming pattern 74 and 74s will not vary substantially as the distance of module 10 to a target is varied.

However, in one variation of the invention, aiming illumination optics are provided so that the sharpness of aiming lines 74 and 74s varies depending on the module to target distance. More specifically, aiming illumination optics may be provided so that aiming lines 74 and 74s are substantially most sharp at the best focus position of module 10-1 and less sharp when a reader equipped with module 10-1 is moved away from the best focus position.

To the end that essentially the entirety of the required electronic circuitry of an optical reader can be packaged into a single printed circuit board, the back surface of the frame's back plate 30 should be configured to accommodate electrical components that will extend from the front surface 15 of PCB 14. Accordingly, it is seen that the rear surface of back plate 30 includes a central recess 34 for aligning and receiving solid state image sensor 32 and peripheral recesses 35 for accommodating electrical circuitry such as components and/or conductors which may protrude from the front surface of PCB 14.

In the embodiment of FIGS. 3a–3d imaging module 10-2 includes a printed circuit board 14 having both an image sensor 32 and illumination LEDs 16 mounted thereon. A pair of LEDs are mounted on either side of image sensor chip 32 to form a pattern of LEDs comprising four substantially linearly arranged LEDs. Mounting of LEDs in a horizontally oriented linear pattern reduces the height dimension requirements of module 10-2 relative to that of module 10-1. Mounting of LEDs in a horizontally oriented linear pattern allows the height of module to be reduced to a height closer to the height o image sensor 32. Referring to further aspects of module 10-2, module 10-2 includes a containment and retainer assembly 80 mounted to and extending from PCB 14. Containment section 81 contains image sensor chip 32 while retainer section 82 retains lens assembly 41. Retainer 82 also prevents light rays not corresponding to the image at a target, notably rays emanating directly from LEDs 16 from reaching image sensor 32.

In the embodiment of FIGS. 4a–4d imaging module 10-3 includes a printed circuit board 14 having mounted thereon an image sensor chip 32, illumination LEDs 16, and aiming LEDs 18. Three LEDs are mounted on either side of module 10-3 to form a horizontally oriented substantially liner pattern of LEDs comprising six LEDs. Inner LEDs 18 are aiming LEDs while outer LEDs 16 are illumination LEDs. Illumination LEDs 16 may can be canted (mounted at angles) as best seen in FIG. 4d so that a center of a target area is more uniformly illuminated absent additional illumination optics.

Further variations of imaging modules are shown in FIGS. 5a–5e. In module 10-4 of FIG. 5a the configuration of containment and retainer assembly 80 is modified so that assembly 80 is box shaped and of substantially uniform height, width and depth. Box-shaped containment and retainer assembly 80, particularly when sized to a height substantially equally to that of circuit board 14 provides certain packaging advantages. For example, if module 10-4 is mounted in an instrument housing so that assembly 80 abuts on a planar surface of an instrument housing, box shaped assembly 80 aids in the stabilization of module 10-4. Module 10-5 shown in FIG. 5*b* comprises a configuration essentially identical to module 10-4 except that the leaded LEDs are replaced with surface mounted LEDs 16*s* and 18*s*. It is understood that the leaded LEDs described herein can normally be replaced with surface mounted LEDs as seen in FIG. 5*b*.

Modules 10-2, 10-3, 10-4, and 10-5 may be used in combination with illumination optics mounted to a separate member of an instrument housing. Alternatively, illumination optics can be incorporated into the module as illustrated by modules 10-6, 10-7 and 10-8 of FIGS. 5*c*, 5*d*, and 5*e*. Module 10-6 of FIG. 5*c* includes form fit diffusers 83 which are adapted to be friction-fit over illumination LEDs 16. In the embodiments shown in FIG. 5*d* module 107 includes optical flange 84 extending outwardly from assembly 80. Each flange 84 may include slit aperture 43 for shaping light from aiming LEDs 18 and a diffuser optical plate 27: for diffusing light from illumination LEDs16. Diffusers 27" may be molded into flanges 84. Flanges 84 may be formed integral with retainer assembly 80 using a mold adapted for manufacture of a one piece containment, retainer and flange assembly. Flanges 84 may also be mounted to PCB 14 or to a member of the instrument housing in which the module is installed. Module 10-8 shown in FIG. 5*e* is similar to module 10-7 except that leaded LEDs are replaced with face mounted LEDs 16*s* and 18*s*. In addition, flanges 84 of module 10-8 are spaced apart at a closer distance to PCB 14 than flanges 84 module 10-7.

Diffuser optical plates 27" include horizontally oriented substantially cylindrical microlenses 27L formed on a light exit surface of diffusers 27". As explained previously in connection with FIGS. 2*a*, 2*b*, and 2*c*, substantially cylindrical microlenses 27-L operate to diffuse light vertically with respect to lenses 27L, to increase the height dimension of the overall illumination pattern generated using a linearly arranged set of light sources.

Another imaging module is shown in FIGS. 6*a*–6*d*. In module 10-9, a flexible printed circuit board 14' carries an image sensor chip 32 and light pipes 86-1 for transmitting light from a source location 85-1 to a light pipe distal end 87 remote from the source location. Light pipes 86-1 are shown as being provided by a fiber optic cable. However, light pipes 86-1 may also be molded light pipes. Fiber optic cables are available from several manufacturers including Schott Corp. of Wayzata, Minn. and Bivaropto, Inc. of Irvine, Calif. Light pipes 86-1 can be any length and can be mounted at substantially any location of flexible circuit board 14'. It will be appreciated that the configuration of module 10-9 allows installation of module 10-9 into a wide variety of instrument housings and equipment. Flexible circuit board 14' which may be a type available from Minco, Inc. of Minneapolis, Minn., may be bended into a virtually limitless number of forms to allow installation of module 10-9 into instrument housings of a wide variety of shapes and sizes. Furthermore, light pipes 86-1 provide illumination of a target area T without requiring that space consuming LEDs to be mounted in a certain arrangement about an imaging axis. An important advantage of incorporating light pipes 86-1 into an imaging module 10-9 is that the radiance of illumination emitted by an individual light pipe can be increased without increasing the space consumed by the distal end 87 of the individual light pipe. The radiance of light emitted at a distal end 87 of a light pipe can be increased by directing light from more than one source into a source end 85-1 of the light pipe. A source end of a light pipe can be split into two or more light entry units, each of which is disposed in proximity with a light source such as an LED. Also, a light pipe can be made to have a diameter enabling it to receive light from more than one light source.

Now referring to FIGS. 7*a*–7*e* an imaging module 10-12 is described having molded light pipes 86-2. In module 10-12, PCB 14 is arranged parallel to imaging axis, $a_i$, and image sensor chip 32 is mounted perpendicularly on PCB 14. Image sensor chip 32 may be perpendicularly mounted on PCB 14 by using a rigid flex PCB. Referring to further aspects of module 10-12, LEDs 16*s* and 18*s* so that light from LEDs 16*s* and 18*s* is directed through distal ends 87-2 of light pipes in a direction generally parallel to imaging axis, $a_i$, toward a target T. Molded light pipes are available from such manufacturers as Bivaropto, Inc. of Irvine Calif. and Dialight Corp. of Manasquan, N.J. Diffusers can be molded onto the distal ends of illumination light pipes 86-2*i* as is indicated by diffuser 89-2*d* shown in FIG. 7*i*.

Arranging PCB 14 parallel to imaging axis, $a_i$, and installing molded light pipe 86-2 on PCB 14 to direct light in a direction parallel to PCB 14 reduces the height dimension of module 10-12 and allows the module to be installed in a "thin" instrument housing having a small height dimension. The height dimension of an imaging module 10-12 having light pipe illumination can be reduced further by back mounting of image sensor chip 32 on PCB 14, as is illustrated by module 10-13 shown in FIGS. 7*e*–7*h*. In the embodiment of FIGS. 7*e*–7*h* image sensor chip 32 is back mounted on PCB 14 together with a containment and retainer assembly 80 that is equipped with folding optics sufficient to fold imaging axis, $a_i$, substantially 90 degrees. Folding optics can be provided, for example, by formation of plated reflective material on or by affixing a mirror to wall 90 as indicated by dashed-in mirror 91. Because module 10-13 can be designed to have a height dimension smaller than the width of image sensor 32, module 10-13 is especially well-suited for installation in "thin" reader housings. For example, module 10-13 is well suited for installation into the housings of a personal data assistant "PDA" such as a cellular phone as shown in FIG. 9I, or a hand-held computer as shown in FIG. 9J.

As in the case of a fiber optic cable light pipe, the radiance of illumination emitted by any one molded light pipe 86-2 can be increased by widening source end 85-2 of pipe 86-2 and disposing source end 85-2 to collect light from more than one light source, as is indicated by light pipe 86-2*i*. Illumination light pipe 86-2*i* of module 10-12 shown in FIG. 7*d* collects light from three face mounted LEDs 16*s* whereas aiming light pipes 86-2*a* collects light from a single LED 18*s*.

Figure 7A:
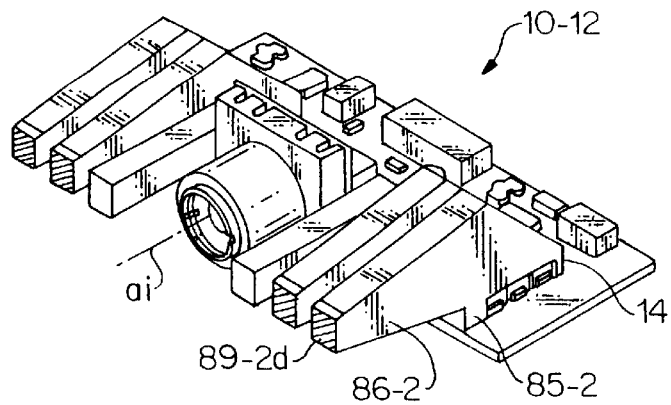
FIGS. 7a–7d are various views of an imaging module according to the invention having molded light pipe illumination.
Figure 7B:
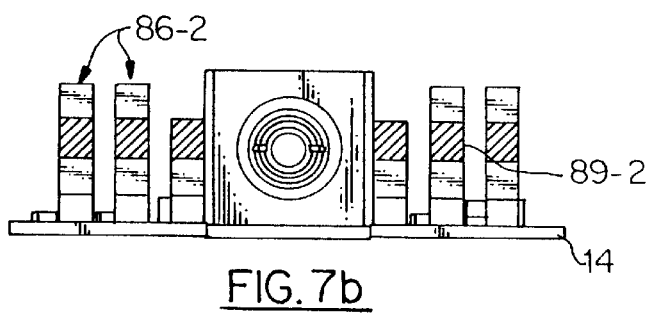
Figure 7C:
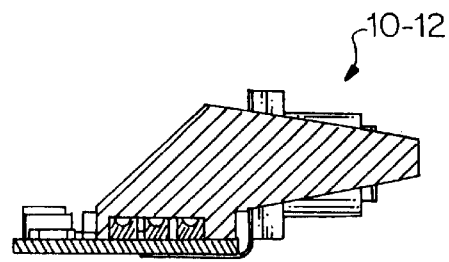
Figure 7D:
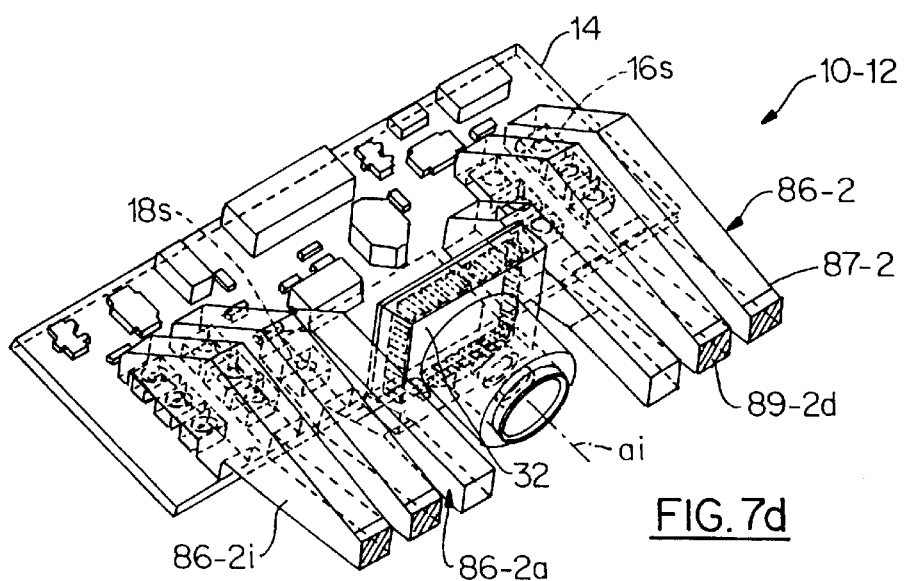
Figure 7I:
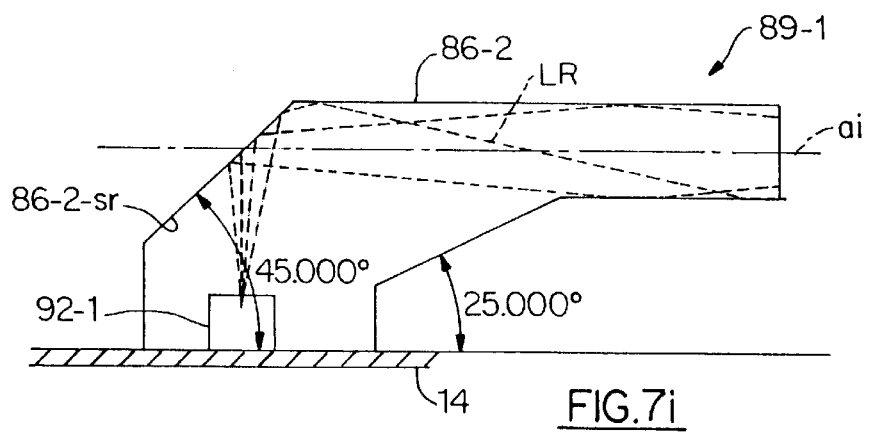
FIGS. 7i–7k are side views of various light pipe and illumination assemblies according to the invention.

Variations of molded light pipe and LED assemblies are described in greater detail with reference to FIGS. 7*i*, 7*j*, and 7*k*. In the embodiment of FIG. 7*i* light pipe and light source assembly 89-1 includes a single surface mount LED package 92-1 mounted to PCB 14. LED 92-1 includes a single LED die. Further with reference to the embodiment of FIG. 7*i* light pipe 86-2 is manufactured and mounted so that primary light refractive surface 86-2-*sr* of light pipe 86-2 forms a constant substantially 45 degree angle with PCB 14.

Figure 7J:
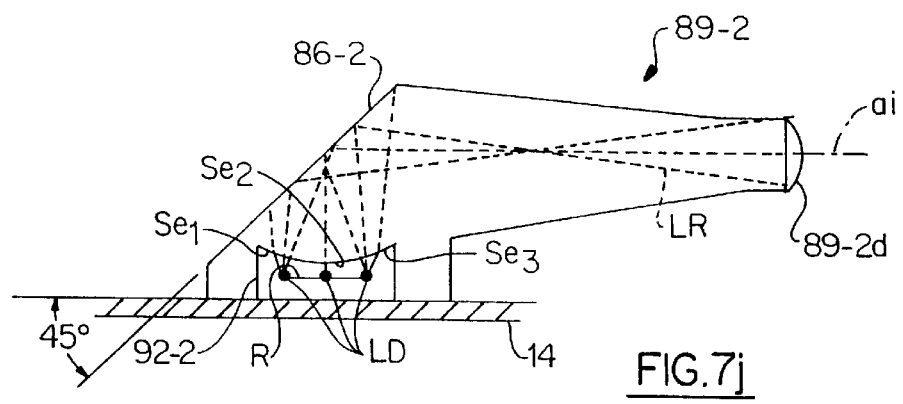

In the embodiment of FIG. 7*j* light pipe and light source assembly 89-2 includes a multiple lead frame surface mount package 92-2. LED 92-2 has three LED dies LD mounted therein and a single Bragg reflector R. Disposing multiple LED dies LD in a LED package having a single Bragg reflector R reduces the size of the surface mount LED package. Further with reference to the embodiment of FIG. 7j the light entry surface of light pipe are separated into three sections $se_1$, $se_2$, and $se_3$, each corresponding to one of the LED dies LD. Each light entry surface $se_1$, $se_2$, and $se_3$ forms a different angle with PCB 14 so as to optimize the efficiency of light transmission through light pipe for each of the LED dies LD. A diffuser optical plate 89-2d can be molded onto distal end of light pipe 86-2. Diffuser optical plate 89-2d diffuses light from light pipe 86-2 and further reduces fresnel losses.

Figure 7K:
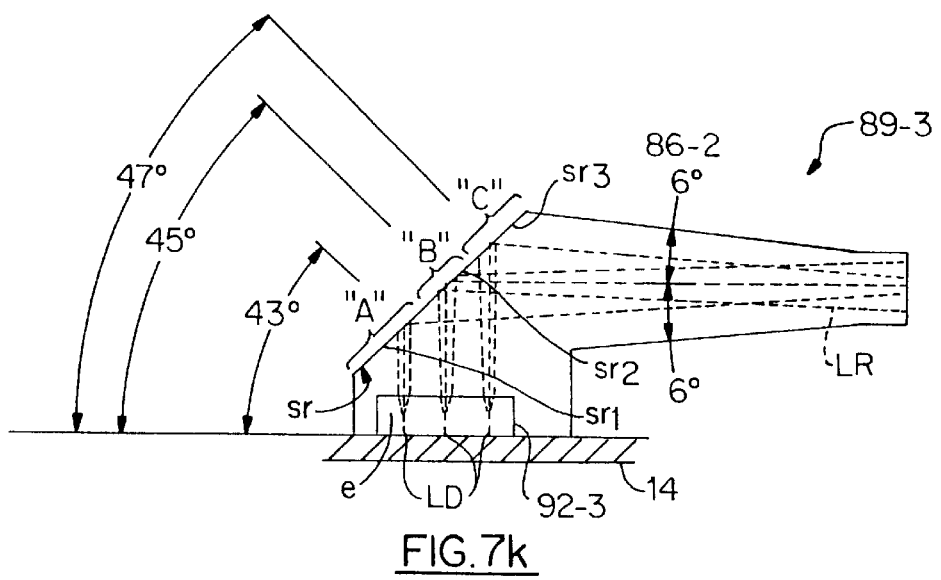

In the embodiment of FIG. 7k light pipe and light source assembly 89-3 includes a LED having three LED dies LD, each formed by mounting a light emitting die on PCB 14 directly, and disposing epoxy e over the assembly of PCB mounted dies. Direct mounting of LED dies LD onto PCB 14 reduces the size of LED package 92-3. Further referring to the embodiment of FIG. 7k the primary light reflective surface sr of assembly 89-3 is divided into three sections $sr_1$, $sr_2$, and $sr_3$ each corresponding to a different one of the LED dies LD. Each section $sr_1$, $sr_2$, and $sr_3$ of light reflective curved surface sr forms a different angle with PCB 14 so as to optimize the efficiency of light transmission through light pipe 86-2 for each of the LED dies LD. For reducing Fresnel losses in system 89-3, the index of refraction, $N_e$, of epoxy e can be selected to substantially match the index of refraction, $N_p$, of molded light pipe 86-2.

Assembly 89-3 of FIG. 7k and assembly 89-2 of FIG. 7j illustrate two different systems for optimizing the efficiency in light transmission through a light pipe in a light pipe and source assembly having multiple dies. LEDs 92-2 and LED 92-3 are single light sources which comprise multiple dies. It will be understood that either of these systems can be employed in a light pipe and light source assembly having multiple light sources, wherein the multiple sources comprise standard surface mount LEDs having one Bragg reflector per die or standard single die leaded LEDs. Light rays LR depicted in FIGS. 7i, 7j, and 7k are shown as originating from ideal light sources LD. It is understood that actual light sources exhibit substantially greater variety in the origin and angles of the incident rays. It will be understood further that any of the LEDs, e.g. LED 16, LED 18, LED 16s, and LED 18s described herein can be provided by an LED package having multiple LED dies incorporated therein. Infineon Corp. of München, Germany specializes in designing and manufacturing LEDs comprising multiple LED dies.

An important feature of the invention is that essentially all the illumination elements of a reader in which module 10 is to be incorporated are included on a single circuit board shown as being provided by PCB 14. This is in contrast to the design of the prior art reader shown in FIG. 10 in which illumination elements and image sensing elements are spread out over several circuit boards. In the prior art device shown in FIG. 10, an aiming illumination source 53 is mounted to a first circuit board 54, illumination LEDs 55 are mounted to a second circuit board 56, while image sensor 32 is mounted to first circuit board 54. The device of FIG. 10 further includes a third circuit board 60 carrying signal processing and decoding electrical hardware components. The assembly of a module of this prior art design is difficult and requires material components not required by the design of the present invention including circuit boards 54, 56 and electrical connectors between the circuit boards such as connectors 57A & 57B. Providing a single circuit board that carries an image sensor, illumination LEDs, and aiming LEDs significantly simplifies assembly, reduces material consumption and thereby reduces the overall cost of producing the module.

Another important aspect of the invention, in one embodiment, is that essentially all electronic circuitry supporting the data processing operations required of module 10 are located on single, full function PCB 14, including circuitry for processing signals generated from image sensor 32, circuitry for capturing image data into a memory device, circuitry for decoding and/or recognizing indicia represented in captured image data. Circuitry for supporting serial transfers of data to peripheral devices may also be carried by PCB 14.

The all in one PCB arrangement of the present invention is in contrast to the traditional design in the prior art wherein circuitry for processing signals from an image sensor, circuitry for capturing and decoding image data and circuitry supporting serial interfacing with external devices are spread out over more than one circuit board.

Figure 10:
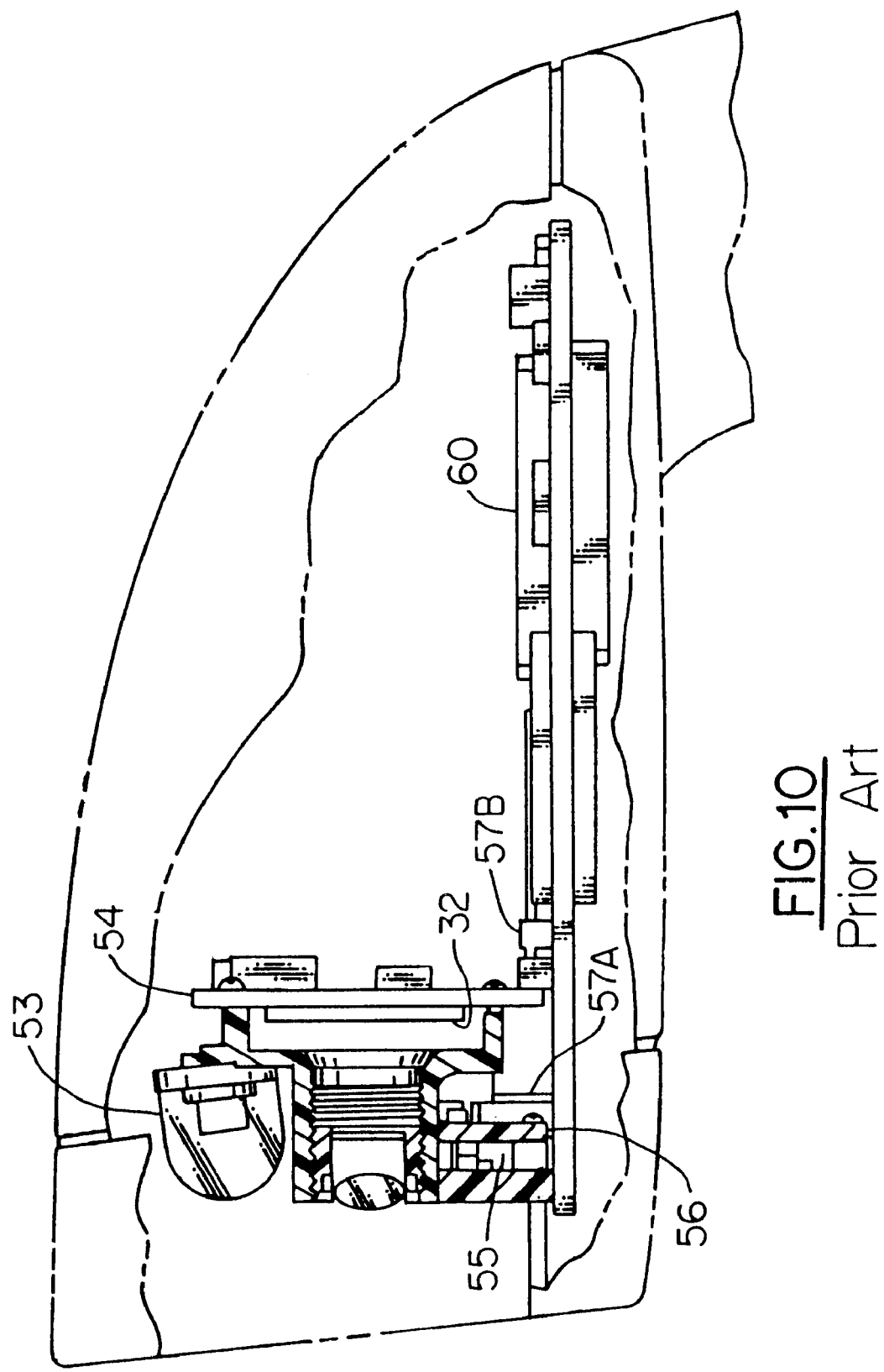
FIG. 10 is a side view of prior art optical reader module.

In the design of the prior art reader shown in FIG. 10, a first vertically oriented circuit board 56 is provided for carrying circuitry for processing signals generated by an image sensor 32 and a second horizontally oriented circuit board 60, known as a "mother board" is provided for carrying circuitry for storing image data and for decoding symbologies. The one PCB design of the present invention provides numerous advantages over the two PCB designs of the prior art. The multiple circuit board arrangement of the prior art requires a complex assembly procedure wherein the first circuit board 56 is mounted to a first internal structure of the reader in which it is incorporated, the second circuit board is mounted to a second internal structure of the reader, and then the two circuit boards are electrically connected. The separate horizontal and vertical orientations of the two circuit boards 56 and 60 are inefficient in terms of space consumption and impose restrictions on the configurations of housing in which the reader optical and electrical components may be incorporated. The one full function PCB design of the present invention does not exhibit these disadvantages.

A block diagram illustrating one type of optical reading device in which the invention may be incorporated is described with reference to FIG. 8.

Optical reader 110 includes an illumination assembly 120 for illuminating a target object T, such as a 1D or 2D bar code symbol, and an imaging assembly 130 for receiving an image of object T and generating an electrical output signal indicative of the data optically encoded therein. Illumination assembly 120 may, for example, include an illumination source assembly 122, such as one or more LEDs, together with an illuminating optics assembly 124, such as one or more lenses, reflectors or other optical elements such as diffusers and wedges 27 and 28, for directing light from light source 122 in the direction of target object T. The illumination assembly in the embodiment of FIGS. 1A–1D is provided entirely by LEDs 16. Illumination assembly 120 may be eliminated if ambient light levels are certain to be high enough to allow high quality images of object T to be taken. Illumination assembly 120 may comprise white LEDs, red LEDs, a combination of these, or other types of light sources. Imaging assembly 130 may include an image sensor 132, such as a 1D or 2D CCD, CMOS, NMOS, PMOS, CID OR CMD solid state image sensor, together with an imaging optics assembly 134 for receiving and focusing an image of object T onto image sensor 132. The array-based imaging assembly shown in FIG. 1F may be replaced by a laser array based imaging assembly comprising at least one laser source, a scanning mechanism, emit and receive optics, at least one photodetector and accompanying signal processing circuitry. Technologies for fabrication of LEDs and white LEDs in particular are described in an article entitled "LEDS light of the Future" in the online magazine MIT Enterprise Technology Review, www.technology review.com/magazine/sep.00/savage.asp.

Optical reader 110 of FIG. 9 also includes programmable control unit 140 which preferably comprises an integrated circuit microprocessor 142 and an application specific integrated circuit (ASIC 144). The function of ASIC 144 could also be provided by field programable gate array (FPGA). Processor 142 and ASIC 144 are both programmable control devices which are able to receive, output and process data in accordance with a stored program stored in memory unit 145 which may comprise such memory elements as a read/write random access memory or RAM 146 and an erasable read only memory or EROM 147. RAM 146 typically includes at least one volatile memory device but may include one or more long term non-volatile memory devices. Processor 142 and ASIC 144 are also both connected to a common bus 148 through which program data and working data, including address data, may be received and transmitted in either direction to any circuitry that is also connected thereto. Processor 142 and ASIC 144 differ from one another, however, in how they are made and how they are used.

Figure 8:
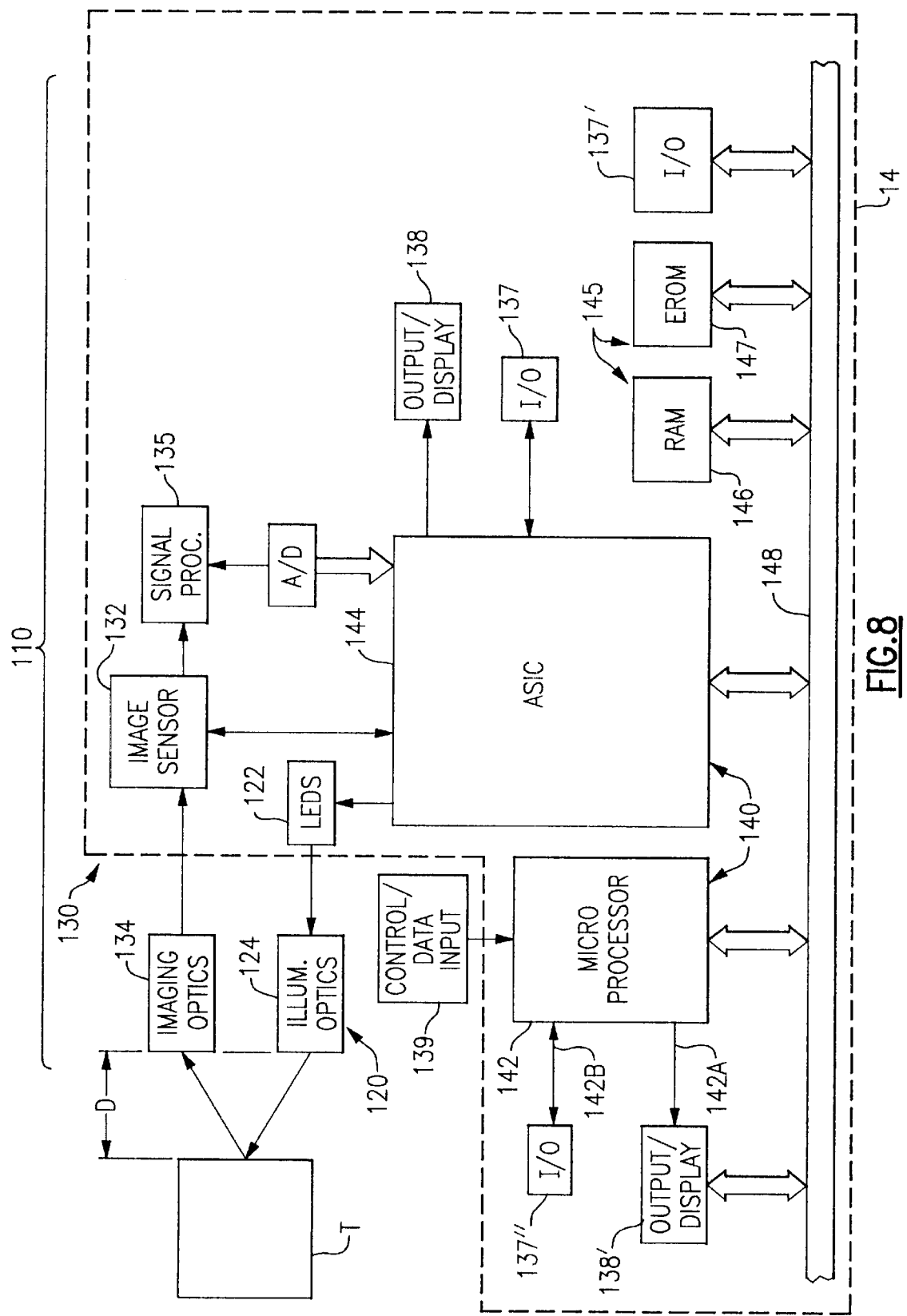
FIG. 8 is a block electrical diagram of the component of an optical reader which may be mounted on a printed circuit board.

More particularly, processor 142 is preferably a general purpose, off-the-shelf VLSI integrated circuit microprocessor which has overall control of the circuitry of FIG. 8, but which devotes most of its time to decoding image data stored in RAM 146 in accordance with program data stored in EROM 147. Processor 144, on the other hand, is preferably a special purpose VLSI integrated circuit, such as a programmable logic or gate array, which is programmed to devote its time to functions other than decoding image data, and thereby relieve processor 142 from the burden of performing these functions.

The actual division of labor between processors 142 and 144 will naturally depend on the type of off-the-shelf microprocessors that are available, the type of image sensor which is used, the rate at which image data is output by imaging assembly 130, etc. There is nothing in principle, however, that requires that any particular division of labor be made between processors 142 and 144, or even that such a division be made at all. This is because special purpose processor 144 may be eliminated entirely if general purpose processor 142 is fast enough and powerful enough to perform all of the functions contemplated by the present invention. It will, therefore, be understood that neither the number of processors used, nor the division of labor therebetween, is of any fundamental significance for purposes of the present invention.

With processor architectures of the type shown in FIG. 8, a typical division of labor between processors 142 and 144 will be as follows. Processor 142 is preferably devoted primarily to such tasks as decoding image data, once such data has been stored in RAM 146, recognizing characters represented in stored image data according to an optical character recognition (OCR) scheme, handling menuing options and reprogramming functions, processing commands and data received from control/data input unit 139 which may comprise such elements as trigger 174 and keyboard 184 and providing overall system level coordination. Processor 144 is preferably devoted primarily to controlling the image acquisition process, the A/D conversion process and the storage of image data, including the ability to access memories 146 and 147 via a DMA channel. Processor 144 may also perform many timing and communication operations. Processor 144 may, for example, control the illumination of LEDs 122, the timing of image sensor 132 and an analog-to-digital (A/D) converter 136, the transmission and reception of data to and from a processor external to reader 110, through an RS-232, a network such as an Ethernet, or a serial bus such as USB, (or other) compatible 110 interface 137 and the outputting of user perceptible data via an output device 138, such as a beeper, a good read LED and/or a display monitor which may be provided by a liquid crystal display such as display 182. Control of output, display and I/O functions may also be shared between processors 142 and 144, as suggested by bus driver I/O and output/display devices 137' and 138' or may be duplicated, as suggested by microprocessor serial I/O ports 142A and 142B and I/O and display devices 137" and 138'. As explained earlier, the specifics of this division of labor is of no significance to the present invention.

In accordance with a feature of one embodiment of the invention described with reference to FIGS. 1A–7H, essentially all of the electrical signal processing components described with reference to FIG. 8 may be carried by a single circuit board, PCB 14 or PCB 14', as is indicated by dashed-in border 14, of FIG. 8. In order to incorporate essentially all of the electrical signal processing components of FIG. 8 onto a single PCB 14, it is normally necessary to integrate several electrical components into a reduced number of electrical components. For example, using known integrated circuit fabrication techniques, components 142, 144, 146, and 147 and interfaces 137, 137', and 137" can be incorporated in a single integrated circuit chip of reduced size. Further, as explained in an article by Eric R. Fossum entitled *Digital Camera System on a Chip*, IEEE Computer Society (IEEE Micro), Volume 18, Number 3, May/June 1998, image sensor 132, signal processing components 135, 136, and components 142, 144, 146, 147, 137, 137', and 137" may be incorporated in a single integrated circuit of reduced size.

Figure 9E:
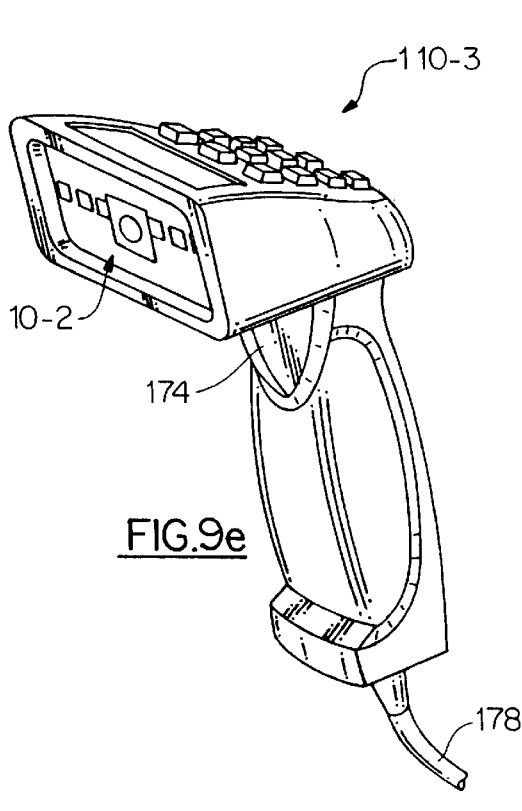
Figure 9F:
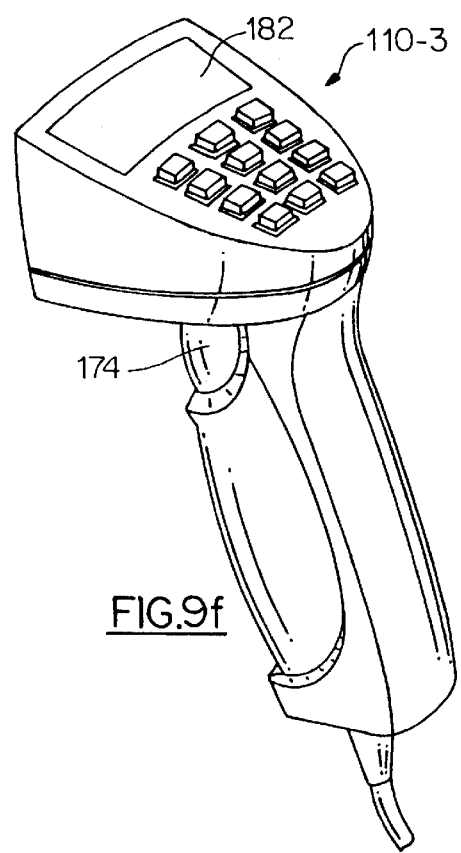
Figure 9G:
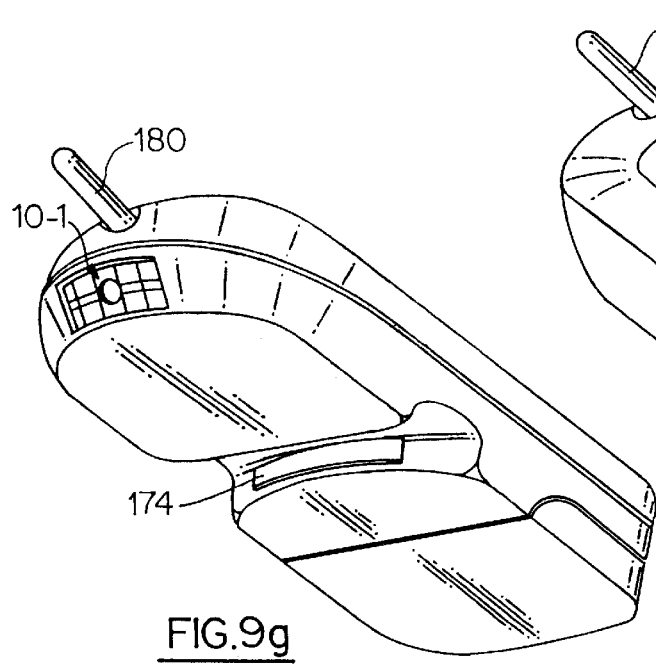
Figure 9H:
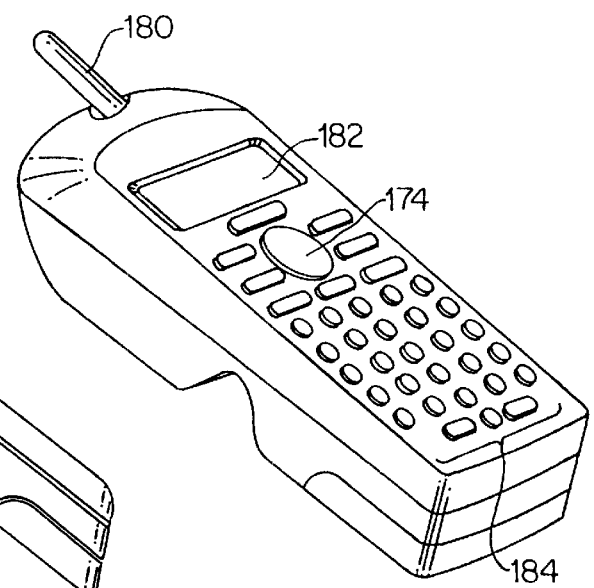
Figure 9I:
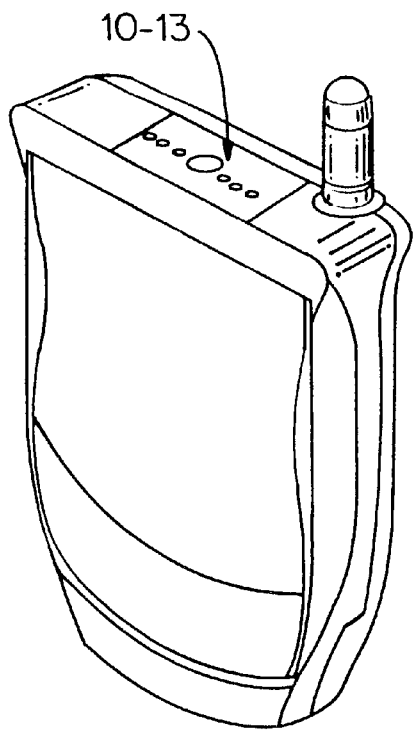
Figure 9J:
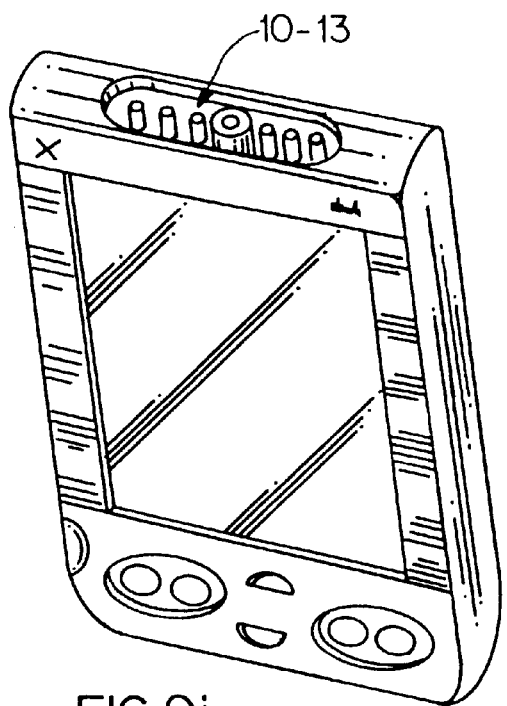

FIGS. 9A–J show examples of types of housings in which the modules of the present invention may be incorporated. FIGS. 9A and 9B show a 1D optical reader 110-1, while FIGS. 9C–9H show 2D optical readers 110-2, 110-3, and 110-4. Housing 112 of each of the optical readers 110-1— 110-4 is adapted to be graspable by a human hand and has incorporated therein at least one trigger switch 174 for activating image capture and decoding and/or image capture and character recognition operations. Readers 110-1, 110-2, and 110-3 include hard-wired communication links 178 for communication with external devices such as other data collection devices or a host processor, while reader 110-4 includes an antenna 180 for providing wireless communication with an external device such as another data collection device or a host processor.

In addition to the above elements, readers 110-3 and 110-4 each include a display 182 for displaying information to a user and a keyboard 184 for enabling a user to input commands and data into the reader.

Figure 9K:
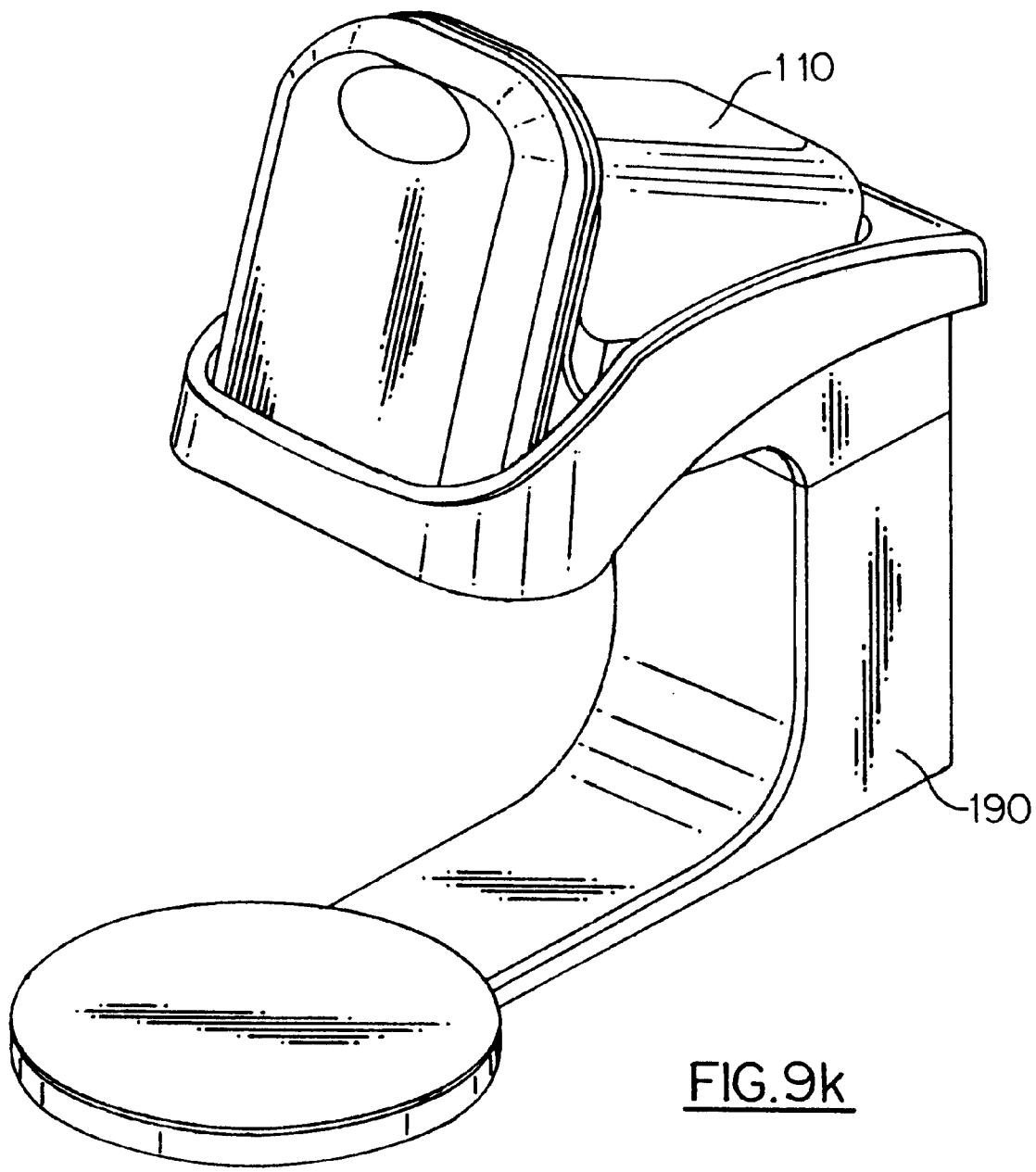

Any one of the readers described with reference to FIGS. 9A–9H may be mounted in a stationary position as is illustrated in FIG. 9K showing a generic optical reader 110 docked in a scan stand 190. Scan stand 190 adapts portable optical reader 110 for presentation mode scanning. In a presentation mode, reader 110 is held in a stationary position and an indicia bearing article is moved across the field of view of reader 110.

While this invention has been described in detail with reference to a preferred embodiment, it should be appreciated that the present invention is not limited to that precise embodiment. Rather, in view of the present disclosure which describes the best mode for practicing the invention, many modifications and variations would present themselves to those skilled in the art without departing from the scope and spirit of this invention, as defined in the following claims.

What is claimed is:

1. An illumination system for an optical reader, said illumination system comprising:
    a plurality of light emitting diodes; and
    an optical member positioned forward of said plurality of light emitting diodes, said optical member having a diffuser surface formed thereon, wherein said diffuser surface comprises microlenses adapted to diffuse light substantially via refractive optics;
    wherein said microlenses comprise a plurality of cylindrical microlenses formed in randomized dimensions on said optical member, and wherein said microlenses have randomized dimensions on the order of from about 0.018" apex-to-apex spacing to about 0.028" apex-to-apex spacing.

2. A The illumination system of claim 1, wherein said plurality of light emitting diodes comprise at least one vertically oriented column of light emitting diodes, and wherein said diffuser surface comprises substantially vertically oriented substantially cylindrical microlenses for diffusing light substantially horizontally with respect to said substantially cylindrical microlenses.

3. The illumination system of claim 1, wherein said plurality of light emitting diodes comprising at least one horizontally oriented row of spaced apart light sources and wherein said diffuser surface comprises substantially horizontally oriented substantially cylindrical microlenses for vertically diffusing light transmitted through said optical member.

4. The illumination system of claim 1, wherein said plurality of light emitting diodes comprise a plurality of vertically arranged columns of light sources, and wherein said diffuser surface comprises vertically oriented substantially cylindrical microlenses for diffusing light substantially horizontally with respect to said substantially cylindrical microlenses.

5. The illumination system of claim 1, wherein said microlenses are formed substantially throughout a surface of said optical member.

6. The illumination system of claim 1, wherein said microlenses are formed in randomized dimensions on said optical member.

7. The illumination system of claim 1, wherein said microlenses comprise a plurality of cylindrical microlenses.

8. The illumination system of claim 1, wherein said microlenses comprise a plurality of cylindrical microlenses delimited by valleys, and wherein said optical member includes at least one cross-connection defined in said member.

9. The illumination system of claim 8, wherein said at least one cross-connection is a plurality of cross-connections.

10. The illumination system of claim 8, wherein said at least one cross-connection connects an adjacent pair of said valleys.

11. The illumination system of claim 8, wherein said microlenses are formed substantially throughout an entire surface of said optical member.

12. An illumination system for an optical reader, said illumination system comprising:
    a plurality of light emitting diodes; and
    an optical member positioned forward of said plurality of light emitting diodes, said optical member having a diffuser surface formed thereon and at least one wedge for directing light from any of said light emitting diodes to a corner of a target area;
    wherein said diffuser surface comprises a plurality of cylindrical microlenses delimited by a plurality of valleys, there being at least one cross-connection connecting pair of said valleys.

13. The illumination system of claim 12, wherein said diffuser surface comprises refractive optic microlenses.

14. The illumination system of claim 12, wherein said diffuser surface comprises randomized dimensioned microlenses.

15. The illumination system of claim 12, wherein said diffuser surface comprises a plurality of randomized dimensioned cylindrical microlenses.

16. The illumination system of claim 15, wherein said randomized dimensioned cylindrical microlenses are formed throughout substantially an entire surface of said optical member.

17. The illumination system of claim 12, wherein said plurality of cylindrical microlenses are formed substantially throughout an entire surface of said optical member.

18. The illumination system of claim 12, wherein said plurality of microlenses are randomized dimensioned cylindrical microlenses.

19. An imaging module comprising:
    an image sensor;
    at least one light source for illuminating at least part of a target area; and
    an optical member having a diffuser surface formed thereon positioned optically forwardly of said at least one light source, said diffuser surface comprising a plurality of randomized dimensioned cylindrical microlenses;
    wherein said randomized dimensions of said plurality of cylindrical microlenses range on the order of from about 0.018" apex-to-apex spacing to about 0.028" apex-to-apex spacing.

20. The imaging module of claim 19, wherein said at least one light source is a plurality of light emitting diodes.

21. The imaging module of claim 19, wherein said plurality of cylindrical microlenses are delimited by valleys, and wherein said optical member includes at least one cross-connection defined in a said member.

22. The imaging module of claim 19, further comprising a common circuit board commonly carrying said at least one light source and said image sensor.

23. An imaging module comprising:
    an image sensor;
    at least one light source for illuminating at least part of a target area; and
    an optical member having a diffuser surface formed thereon positioned optically forwardly of said at least one light source, said diffuser surface comprising a plurality of cylindrical micro lenses delimited by a plurality of valleys, wherein said optical member further includes at least one cross-connection defined in said optical member.

24. The imaging module of claim 23, wherein said at least one cross-connection is a plurality of cross-connections there being at least one cross- connection defined in a plurality of said valleys.

25. The imaging module of claim 23, wherein said cylindrical microlenses are randomized dimensioned cylindrical microlenses.

26. the imaging module of claim 25, wherein said randomized dimensioned cylindrical microlenses are dimensioned on the order of from about 0.018" to about 0.028" apex-to-apex distance.

27. The imaging module of claim 23, wherein said at least one light source is a plurality of light emitting diodes.

28. The imaging module of claim 23, wherein said imaging module includes a common circuit board commonly carrying both of said at least one light source and said image sensor.

29. The imaging module of claim 23, wherein said at least one cross-connection connects a pair of said valleys.

30. An illumination system for an optical reader, said illumination system comprising:

a plurality of light emitting diodes; and an optical member positioned forward of said plurality of light emitting diodes, said optical member having a diffuser surface formed thereon, wherein said diffuser surface comprises microlenses adapted to diffuse light substantially via refractive optics;

wherein said microlenses comprise a plurality of cylindrical microlenses delimited by valley, and wherein said optical member includes at least one cross-connection defined in said member.

31. The illumination system of claim 30, wherein said plurality of light emitting diodes comprise at least one vertically oriented column of light emitting diodes, and wherein said diffuser surface comprises substantially vertically oriented substantially cylindrical microlenses for diffusing light substantially horizontally with respect to said substantially cylindrical microlenses.

32. The illumination system of claim 30, wherein said plurality of light emitting diodes comprising at least one horizontally oriented row of spaced apart light sources and wherein said diffuser surface comprises substantially horizontally oriented substantially cylindrical microlenses for vertically diffusing light transmitted through said optical member.

33. The illumination system of claim 30, wherein said plurality of light emitting diodes comprise a plurality of vertically arranged columns of light sources, and wherein said diffuser surface comprises vertically oriented substantially cylindrical microlenses for diffusing light substantially horizontally with respect to said substantially cylindrical microlenses.

34. The illumination system of claim 30, wherein said microlenses are formed substantially throughout a surface of said optical member.

35. The illumination system of claim 30, wherein said microlenses are formed in randomized dimensions on said optical member.

36. The illumination system of claim 30, wherein said microlenses comprise a plurality of cylindrical micro lenses.

37. The illumination system of claim 30, wherein said microlenses comprise a plurality of cylindrical microlenses formed in randomized dimensions on said optical member.

38. The illumination system of claim 37, wherein said microlenses have randomized dimensions on the order of from about 0.018" to about 0.028" apex-to-apex spacing.

39. The illumination system of claim 30, wherein said at least one cross-connection is a plurality of cross-connections.

40. The illumination system of claim 30, wherein said at least one cross-connection connects an adjacent pair of said valleys.

41. The illumination system of claim 30, wherein said microlenses are formed substantially throughout an entire surface of said optical member.

\* \* \* \* \*